US012805046B2

(12) United States Patent
Kim et al.

(10) Patent No.: US 12,805,046 B2
(45) Date of Patent: Nov. 17, 2026

(54) IMAGE SENSOR

(71) Applicant: SAMSUNG ELECTRONICS CO., LTD., Suwon-si (KR)

(72) Inventors: Wonhyeok Kim, Suwon-si (KR); Uisik Kim, Suwon-si (KR); Iljoong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 19/021,000

(22) Filed: Jan. 14, 2025

(65) Prior Publication Data

US 2026/0013256 A1 Jan. 8, 2026

(30) Foreign Application Priority Data

Jul. 2, 2024 (KR) ........................ 10-2024-0086675

(51) Int. Cl.
*H10F 39/00* (2025.01)
*H04N 25/63* (2023.01)

(52) U.S. Cl.
CPC ....... *H10F 39/807* (2025.01); *H10F 39/8037* (2025.01); *H04N 25/63* (2023.01)

(58) Field of Classification Search
CPC .. H10F 39/807; H10F 39/8037; H10F 39/014; H10F 39/18; H10F 39/813; H10F 39/802; H10F 39/8023; H10F 39/8033; H04N 25/63; H04N 25/673
See application file for complete search history.

(56) References Cited

U.S. PATENT DOCUMENTS

2010/0140733 A1* 6/2010 Lee ........................ H04N 25/63 257/447
2022/0093665 A1* 3/2022 Park .................... H10F 39/8053
2023/0362500 A1* 11/2023 Shim ...................... H04N 25/10
2024/0072086 A1* 2/2024 Lee ....................... H10F 39/811

FOREIGN PATENT DOCUMENTS

KR 10-2005-0115813 12/2005

* cited by examiner

*Primary Examiner* — Twyler L Haskins
*Assistant Examiner* — Surafel Yilmakassaye
(74) *Attorney, Agent, or Firm* — Fish & Richardson P.C.

(57) ABSTRACT

An image sensor includes a pixel array extending in a first direction and a second direction that intersect each other and are parallel to a first surface of a substrate. A plurality of pixel regions of the pixel array are separated by a pixel isolation film, each pixel region includes a photodiode. A logic circuit is configured to acquire a pixel signal from the pixel array. The pixel array includes an effective region in which effective pixel regions are disposed, and a dummy region in which dummy pixel regions are disposed around the effective region, and the dummy region includes at least one vertical structure extending from the first surface by a predetermined depth in a third direction, perpendicular to the first surface, and contacting a pixel isolation film within the substrate.

20 Claims, 28 Drawing Sheets

II-II'

IV-IV'

IMAGE SENSOR

CROSS-REFERENCE TO RELATED APPLICATION(S)

This application claims the benefit of priority to Korean Patent Application No. 10-2024-0086675 filed on Jul. 2, 2024, in the Korean Intellectual Property Office, the entirety of which is incorporated herein by reference.

BACKGROUND

An image sensor may be a semiconductor-based sensor receiving light and generating an electric signal, and may include a pixel array having a plurality of pixels, a logic circuit driving the pixel array and generating an image, and the like. Each of the pixels may include a photodiode, and a pixel circuit converting charges generated by the photodiode into the electric signal, and a pixel isolation film may be disposed between the pixels. Various methods for utilizing such a pixel isolation film have been proposed for the purpose of minimizing a dark current, dark level characteristic degradation, or the like, due to charges unintentionally generated in a substrate on which the photodiode is formed.

SUMMARY

Some aspects of the present disclosure provide image sensors forming a vertical structure applying a voltage to a pixel isolation film on a first surface of a substrate on which a transfer gate connected to a photodiode is disposed, to simplify a process of forming the vertical structure and effectively verify characteristics of the pixel isolation film.

According to some implementations of the present disclosure, an image sensor includes a plurality of pixel regions disposed in a first direction and a second direction intersecting each other and parallel to a first surface of a substrate, and in which at least one photodiode is disposed, respectively; and a pixel isolation film disposed between the plurality of pixel regions, wherein the pixel array includes an effective region in which effective pixel regions among the plurality of pixel regions are disposed, and a dummy region in which dummy pixel regions among the plurality of pixel regions are disposed, two or more effective pixel regions adjacent in the first direction and the second direction provide an effective pixel group, and the effective pixel group includes a floating diffusion region shared by two or more photodiodes disposed in the two or more effective pixel regions, two or more dummy pixel regions adjacent in the first direction and the second direction provide a dummy pixel group, and the dummy pixel group includes a vertical structure contacting the pixel isolation film in the substrate, and the floating diffusion region is disposed in a central portion of the effective pixel group, and the vertical structure is disposed in a central portion of the dummy pixel group.

According to some implementations of the present disclosure, an image sensor includes a pixel array including a pixel isolation film extending in a first direction and a second direction intersecting each other and parallel to a first surface of a substrate, and a plurality of pixel regions separated by the pixel isolation film, each of the plurality of pixel regions including a photodiode; and a logic circuit configured to acquire a pixel signal from the pixel array, wherein the pixel isolation film includes a first isolation film and a second isolation film disposed inside the first isolation film in the first direction and the second direction, the pixel array includes an effective region in which effective pixel regions are disposed, and a dummy region in which dummy pixel regions are disposed around the effective region, and the dummy region includes at least one vertical structure extending from the first surface by a predetermined depth in a third direction, perpendicular to the first surface, and contacting the second isolation film within the substrate.

According to some implementations of the present disclosure, an image sensor includes a pixel array including a pixel isolation film extending in a first direction and a second direction intersecting each other and parallel to a first surface of a substrate, a device isolation film disposed between the first surface and the pixel isolation film, a plurality of photodiodes disposed between pixel isolation films, and a vertical structure extending further than a depth of the device isolation film from the first surface; and a logic circuit configured to acquire a pixel signal from the pixel array, wherein the pixel isolation film includes a first isolation film in direct contact with the substrate in the substrate, and a second isolation film disposed inside the first isolation film and in direct contact with the vertical structure in at least one of the first direction and the second direction, the logic circuit applies a negative bias voltage to the second isolation film through the vertical structure.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Figure 1:
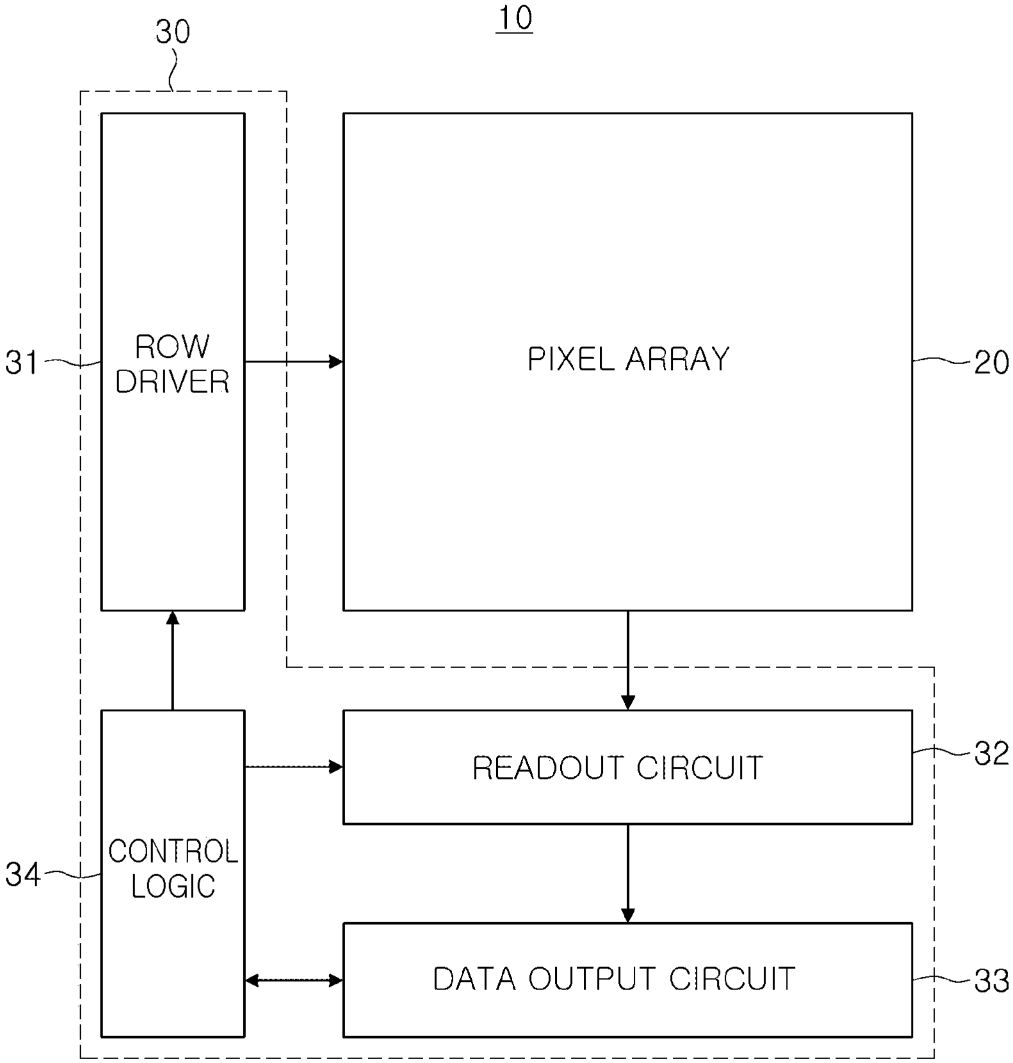
FIG. 1 is a block diagram schematically illustrating an example of an image sensor.

FIG. 1 is a block diagram schematically illustrating an image sensor. Referring to FIG. 1, an image sensor 10 may include a pixel array 20, a logic circuit 30, and the like.

The pixel array 20 may include a plurality of pixels PX arranged in an array shape along a plurality of rows and a plurality of columns. In each of the plurality of pixel regions, at least one photoelectric conversion device that generates charges in response to light may be disposed, and the photoelectric conversion device may be connected to a pixel circuit that generates a voltage signal corresponding to the charges generated by the photoelectric conversion device. A pixel may be implemented by the photoelectric conversion device and the pixel circuit. The photoelectric conversion device may include a photodiode formed of a semiconductor material, an organic photodiode formed of an organic material, and/or the like.

For example, the pixel circuit may include a floating diffusion region, a transfer transistor, a reset transistor, a drive transistor, a select transistor, and the like. However, the configuration of the pixel circuit may be changed according to various implementations and is not limited to the foregoing. For example, to implement an additional function for each of the pixels, a larger number of transistors may be included in the pixel circuit. As another example, the pixels may be implemented as digital pixels, and, in this case, the pixel circuit may include an analog-to-digital converter for outputting a digital pixel signal.

The logic circuit 30 may include circuits for controlling the pixel array 20. For example, the logic circuit 30 may include a row driver 31, a readout circuit 32, a data output circuit 33, a control logic 34, and the like. The row driver 31 may drive the pixel array 20 in units of row lines. For example, the row driver 31 may generate a transfer control signal for controlling the transfer transistor, a reset control signal for controlling the reset transistor, a select control signal for controlling the select transistor, and/or the like for controlling the pixel circuit, and may input the same to the pixel array 20 in units of row lines.

Among the pixels, pixels disposed at the same position in a row direction (horizontal direction in FIG. 1) may share the same column line. For example, pixels disposed at the same position in a column direction (vertical direction in FIG. 1) may be simultaneously selected by the row driver 31, and may output a pixel signal through column lines. In some implementations, the readout circuit 32 simultaneously receives a voltage signal from the pixels selected by the row driver 31 through the column lines. For example, the readout circuit 32 may sequentially receive a reset voltage and a pixel voltage from each of the pixels, and the pixel voltage may be a voltage in which charges generated by a photodiode of each of the pixels may be reflected in the reset voltage.

The readout circuit 32 may include a plurality of correlated dual samplers and a plurality of counters, and the correlated dual samplers may be connected to pixels and column lines. The correlated dual samplers may read a voltage signal from the pixels connected to a row line selected by a row line selection signal of the row driver 31 through the column lines. One input terminal of each of the correlated dual samplers may be connected to column lines, and the other input terminal may receive a ramp voltage.

An output terminal of each of the correlated dual samplers may be connected to counters, and the counters may count time for which output of each of the correlated dual samplers may be maintained at a specific voltage to generate a digital pixel signal. For example, the counter may count time for which a ramp voltage input to a correlated dual sampler is greater than voltage of the column line to convert output of the correlated dual sampler into a digital pixel signal. The data output circuit 33 may include a memory such as a latch, a buffer circuit, and/or the like that temporarily stores the digital pixel signal.

The control logic 34 may include a timing controller for controlling operation timing of the row driver 31, the readout circuit 32, and the data output circuit 33, or the like. In some implementations, the control logic 34 determines a data format output by the data output circuit 33 and/or performs preprocessing of data to be output by the data output circuit 33.

A photodiode disposed along a plurality of pixel regions in the pixel array 20 may generate charges in response to light. Charges may be generated in a substrate on which the photodiode is formed due to causes other than light introduced from the outside, which may lead to deterioration of dark level characteristics of the image sensor 10.

In some implementations, to reduce or minimize the deterioration of the dark level characteristics of the image sensor 10 due to the charges unintentionally generated, a predetermined bias voltage may be applied to a pixel isolation film disposed between the pixel regions. For example, a circuit applying a negative bias voltage to a pixel isolation film may be included in the logic circuit 30, and the negative bias voltage may be applied to the pixel isolation film, to remove charges such as holes or the like generated in the substrate.

In some implementations, to electrically connect the circuit applying the bias voltage and the pixel isolation film, vertical structures that contact the pixel isolation film may be formed on one surface of the substrate. Each of the vertical structures may have a shape that digs into the one surface of the substrate by a predetermined depth, and may be in contact with the pixel isolation film inside the substrate. For example, the one surface of the substrate on which the vertical structures is formed may be a first surface on which a floating diffusion region where charges generated by the photodiode are accumulated, and/or a first surface at which a transfer gate disposed between the photodiode and the floating diffusion region, and/or the like, is formed and/or disposed.

The vertical structures may be formed on the first surface of the substrate to simplify a process of forming the vertical structures. For example, in an etching process in which a portion of the substrate is removed from the first surface to form the transfer gate in each of the plurality of pixel regions, a region in which the vertical structures are disposed may be exposed and etched together, e.g., in the same etching process. In addition, in a process in which a gate electrode layer of the transfer gate is formed of a conductive material such as polysilicon, the vertical structures may be formed together, e.g., in the same process. Therefore, the fabrication process may be simplified by forming the vertical structures without increasing a number of process operations.

Since the vertical structures may be formed on the first surface of the substrate together with the floating diffusion region, the transfer gate, or the like, an interconnection pattern connecting the vertical structures and the logic circuit 30 may be simply formed. In addition, even before a process of the image sensor is finally completed, characteristics of the pixel isolation film may be verified by applying a voltage to the vertical structures. For example, when only a lowest interconnection pattern among the interconnection patterns formed on the first surface of the substrate is formed, characteristics of the pixel isolation film may be verified by applying a voltage to one of the vertical structures and detecting the voltage from the other.

Figure 2:
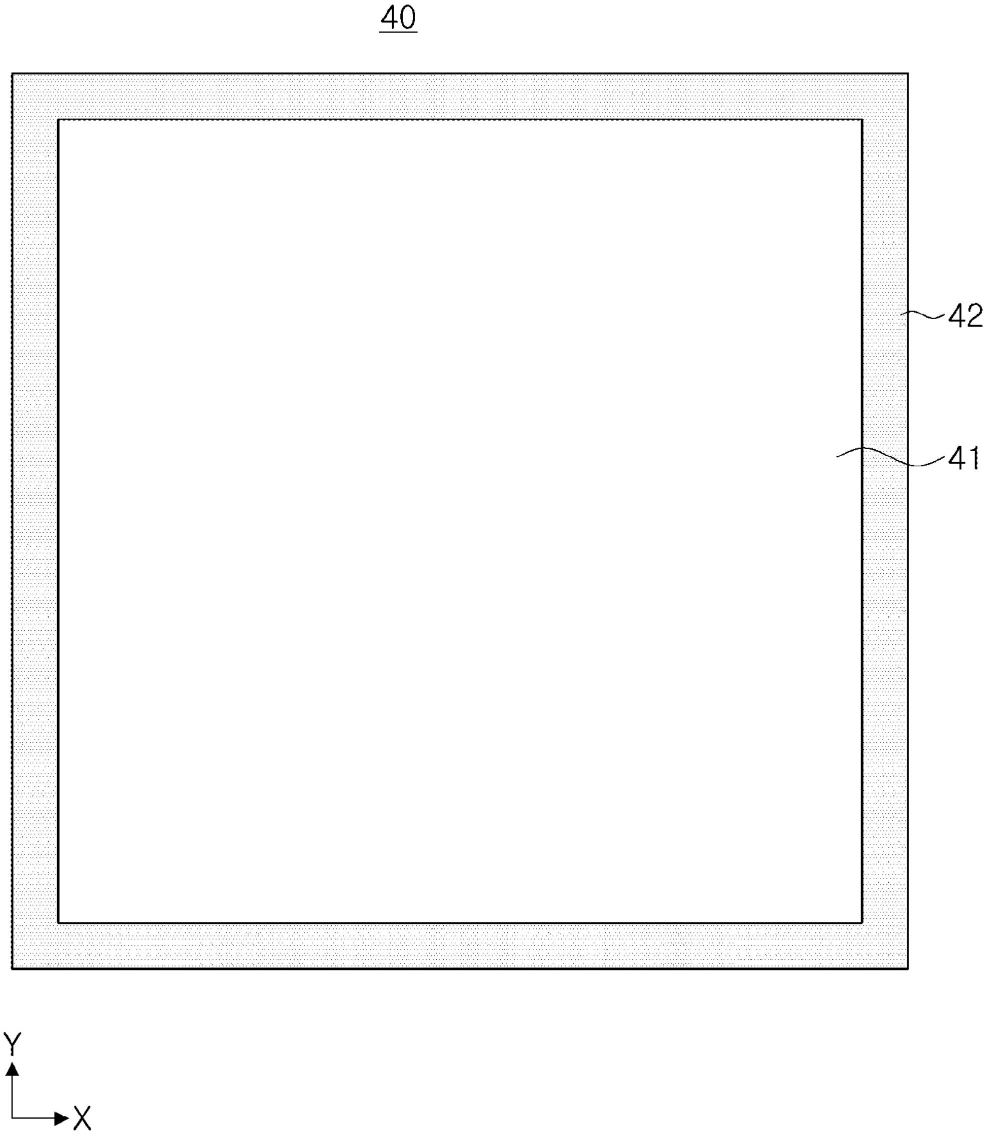
FIGS. 2 and 3 are plan views schematically illustrating an example of a pixel array structure of an image sensor.
Figure 3:
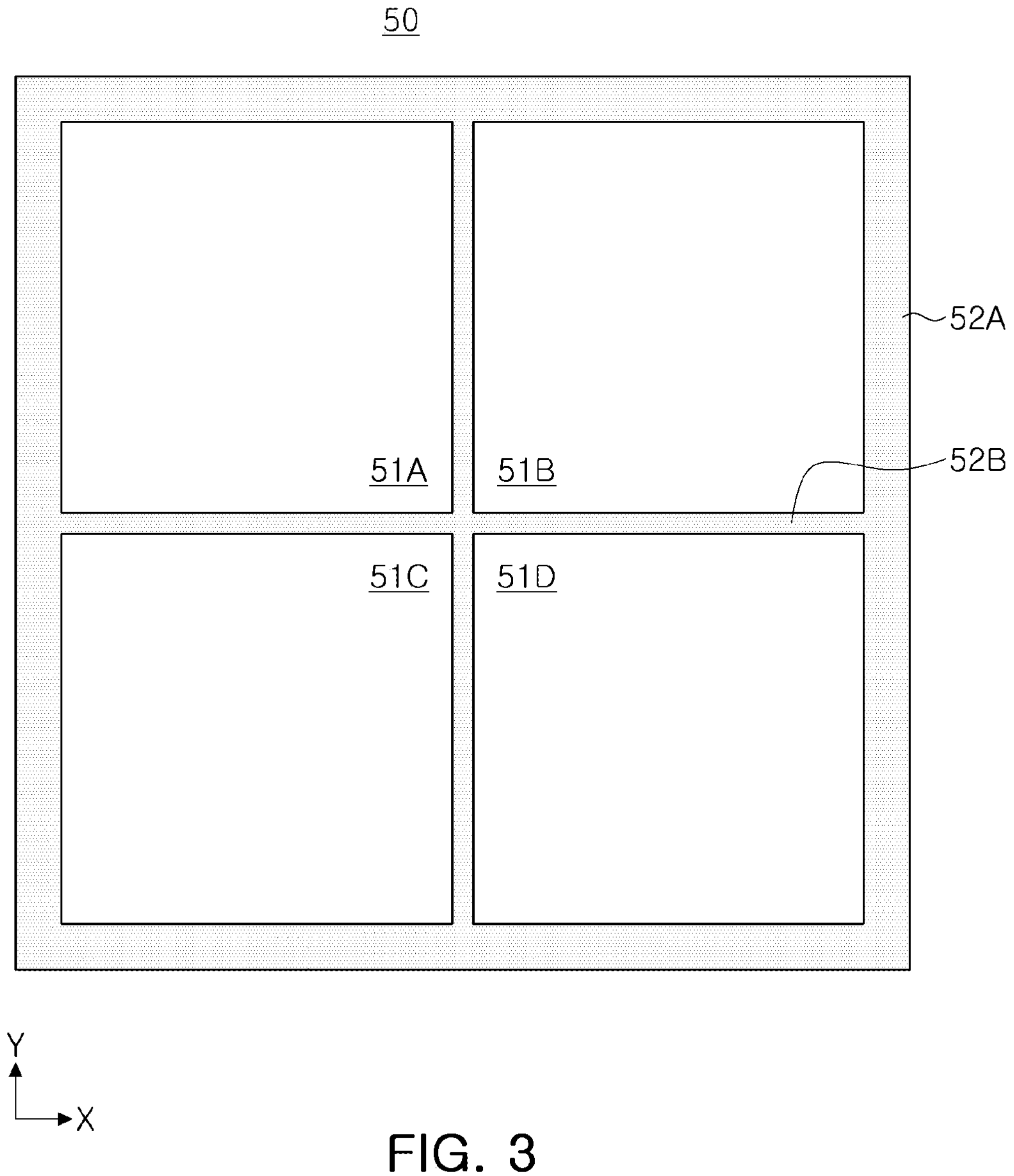

FIGS. 2 and 3 are views schematically illustrating an example of a pixel array structure of an image sensor.

First, a pixel array 40 may include an effective region 41 (alternatively referred to as a "functional region") and a dummy region 42. The effective region 41 may be surrounded by the dummy region 42 in a first direction (X-axis direction) and a second direction (Y-axis direction). In each of the effective region 41 and the dummy region 42, a plurality of pixel regions may be disposed in the first and second directions.

For example, the plurality of pixel regions may include effective pixel regions disposed in the effective region 41, and dummy pixel regions disposed in the dummy region 42. The effective pixel regions and the dummy pixel regions may be separated from each other by a pixel isolation film extending in the first and second directions. Each of the effective pixel regions and the dummy pixel regions may include a photodiode, an active region, a gate structure, and the like, and at least one active region may be provided as a floating diffusion region in which charges generated by the photodiode are stored.

The active region and the gate structure formed in the effective pixel regions may be electrically connected to a logic circuit. In some implementations, the active region and the gate structure formed in the dummy pixel regions are separated from the logic circuit without being electrically connected thereto.

In the dummy region 42, vertical structures may contact a pixel isolation film disposed between the dummy pixel regions. The vertical structures may be in contact with the pixel isolation film between some of the dummy pixel regions, and therefore, the number of vertical structures may be less than the number of dummy pixel regions. In some implementations (e.g., unlike the active region and the gate structure formed in the dummy pixel regions of some implementations), the vertical structures may be electrically connected to the logic circuit, and may provide a transmission path of a bias voltage for removing charges generated in a substrate due to a cause other than externally introduced light.

Next, referring to FIG. 3, a pixel array 50 may include effective regions 51A to 51D and dummy regions 52A and 52B. As described above with reference to FIG. 2, each of the effective regions 51A to 51D and the dummy regions 52A and 52B may have a plurality of pixel regions disposed in the first and second directions.

In some implementations, as illustrated in FIG. 3, the dummy regions 52A and 52B include a first dummy region 52A and a second dummy region 52B. Unlike the first dummy region 52A disposed around the effective regions 51A to 51D, the second dummy region 52B may extend in at least one of the first and second directions, and may be disposed between the effective regions 51A to 51D. Therefore, as illustrated in FIG. 3, the effective regions 51A to 51D may be divided into first to fourth effective regions 51A to 51D.

A vertical structure connected to a pixel isolation film and providing a transmission path of a bias voltage may be disposed in both the first dummy region 52A and the second dummy region 52B. The vertical structure may be formed in the second dummy region 52B disposed between the first to fourth effective regions 51A to 51D and the bias voltage may be applied to shorten the transmission path of the bias voltage. Therefore, charges generated regardless of light incident from the outside may be effectively removed to improve a dark level of an image sensor.

Figure 4:
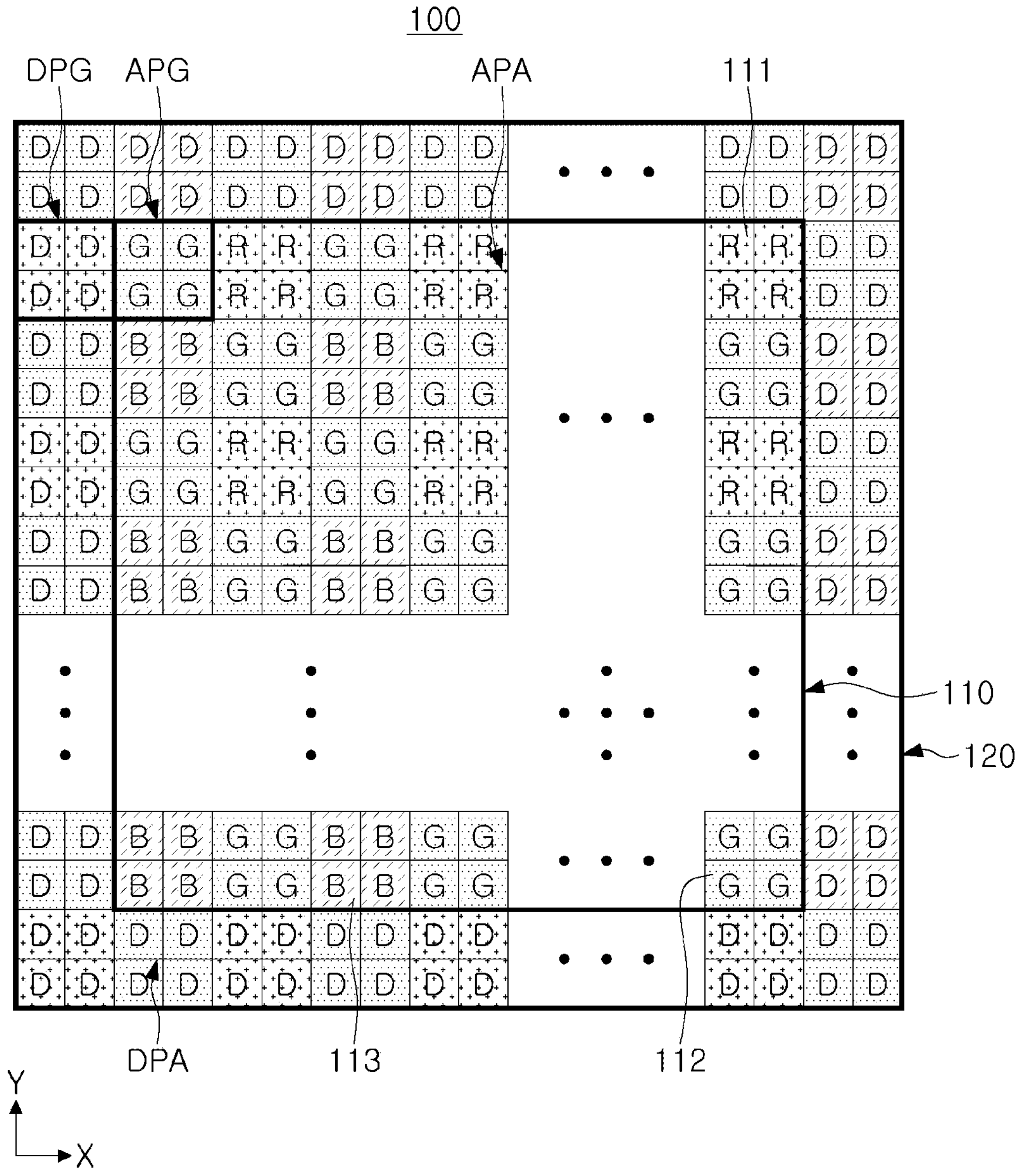
FIG. 4 is a plan view schematically illustrating an example of a pixel array included in an image sensor.

FIG. 4 is a view schematically illustrating an example of a pixel array included in an image sensor.

Referring to FIG. 4, a pixel array 100 included in an image sensor may include a plurality of pixel regions APA and DPA disposed in the first direction (X-axis direction) and the second direction (Y-axis direction). The pixel array 100 may be, for example, the pixel array 20. The plurality of pixel regions APA and DPA may include effective pixel regions APA disposed in an effective region 110, and dummy pixel regions DPA disposed in a dummy region 120. In some implementations, as illustrated in FIG. 4, the dummy region 120 is disposed around the effective region 110. In some implementations, as described above with reference to FIG. 3, the dummy pixel regions DPA may be additionally disposed between at least some of the effective pixel regions APA in the first direction or the second direction.

The plurality of pixel regions APA and DPA may be divided into a red pixel region 111, a green pixel region 112, and a blue pixel region 113, depending on a type of color filter disposed in each. At least some of the pixel regions APA and DPA may not include a color filter transmitting light only in a certain wavelength band.

In the pixel array 100, each of the plurality of pixel regions APA and DPA may include a photodiode. Pixel groups APG and DPG may be defined by two or more pixel regions APA and DPA adjacent to each other in the first and second directions, and for example, each of the pixel groups APG and DPG may include four pixel regions APA and DPA disposed in a 2×2 configuration.

Each of effective pixel groups APG defined in the effective region 110 may include four effective pixel regions APA, and each of dummy pixel groups DPG defined in the dummy region 120 may include four dummy pixel regions DPA. For example, the four effective pixel regions APA included in each of the effective pixel groups APG may include a color filter of the same color, and may share a micro lens, and the four dummy pixel regions DPA included in each of the dummy pixel groups DPG may include a color filter of the same color, and may share a micro lens.

Photodiodes included in each of the effective pixel groups APG may share a pixel circuit. The pixel circuit corresponding to each of the effective pixel groups APG will be described later with reference to FIG. 5. For example, the four effective pixel regions APA included in each of the effective pixel groups APG may include a photodiode and a transfer gate, respectively, and may share a floating diffusion region. In some implementations, in one effective pixel group APG, the floating diffusion region is disposed in a central portion of a region in which the four effective pixel regions APA included in one effective pixel group APG are disposed.

In the dummy pixel group DPG, a vertical structure contacting a pixel isolation film may be disposed in a central portion of a region in which the four dummy pixel regions DPA are disposed. The vertical structure may have a shape digging into or extending into a substrate by a predetermined depth, and may be in direct contact with the pixel isolation film in the substrate. The vertical structure may be disposed only in some of the dummy pixel groups DPG, and may provide a transmission path of a bias voltage for removing charges generated in the substrate due to causes other than light coming in from the outside.

Figure 5:
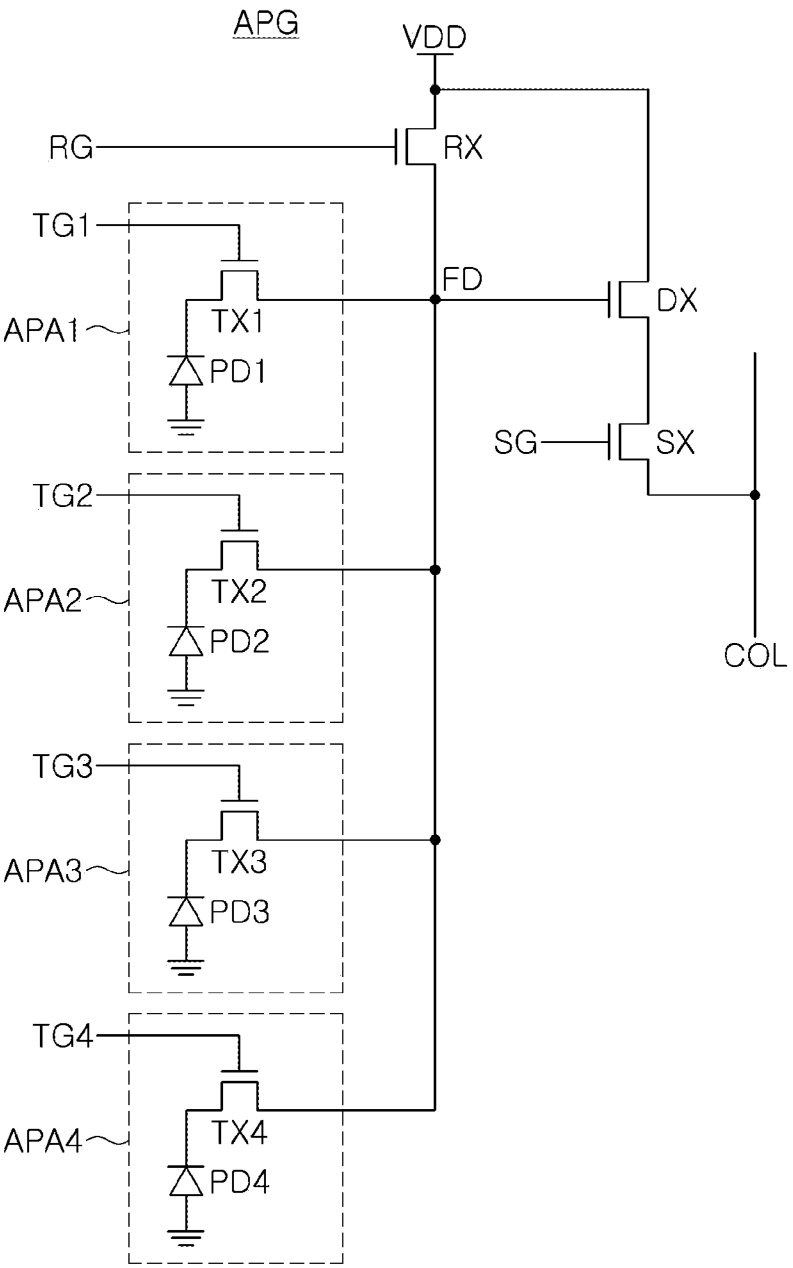
FIG. 5 is a circuit diagram illustrating an example of a pixel circuit.

FIG. 5 is a diagram illustrating an example of a pixel circuit included in an image sensor, e.g., any of the image sensors and pixel arrays described herein.

A pixel circuit as shown in FIG. 5 may correspond to a circuit of each of the effective pixel groups APG described above with reference to FIG. 4. Referring to FIG. 5, one effective pixel group APG may include four effective pixel regions APA1 to APA4, and each of the four effective pixel regions APA1 to APA4 may include one photodiode and one transfer transistor. Referring to FIG. 5, a first effective pixel region APA1 may include a first photodiode PD1 and a first transfer transistor TX1, a second effective pixel region APA2 may include a second photodiode PD2 and a second transfer transistor TX2, a third effective pixel region APA3 may include a third photodiode PD3 and a third transfer transistor TX3, and a fourth effective pixel region APA4 may include a fourth photodiode PD4 and a fourth transfer transistor TX4.

The first to fourth effective pixel regions APA1 to APA4 included in the one effective pixel group APG may share a floating diffusion region FD, a reset transistor RX, a drive transistor DX, and a select transistor SX. For example, pixel signals corresponding to charges generated in each of the first to fourth effective pixel regions APA1 to APA4 may be individually output. For example, while a readout operation for reading a pixel signal corresponding to a charge of the first photodiode PD1 is being performed, the second to fourth transfer transistors TX2 to TX4 may be maintained in a turned-off state.

In some implementations, some of the components included in each effective pixel group APG are distributed and disposed in layers that are stacked on each other. For example, the photodiodes PD1 to PD4, the transfer transistors TX1 to TX4, and the floating diffusion region FD may be formed in one layer, and the reset transistor RX, the drive transistor DX, and the select transistor SX may be formed in another layer. A predetermined contact and a predetermined via structure may be connected to the floating diffusion region FD, and the reset transistor RX and the drive transistor DX may be connected to the via structure.

The floating diffusion region FD shared by the first to fourth effective pixel regions APA1 to APA4 in the one effective pixel group APG may be formed in a central portion of a region in which the effective pixel group APG is disposed. Because the floating diffusion region FD is disposed in the central portion of the region in which the effective pixel group APG is disposed, a difference in distance that charges generated by each of the photodiodes PD1 to PD4 moves to the floating diffusion region FD may be reduced or minimized.

Figure 6:
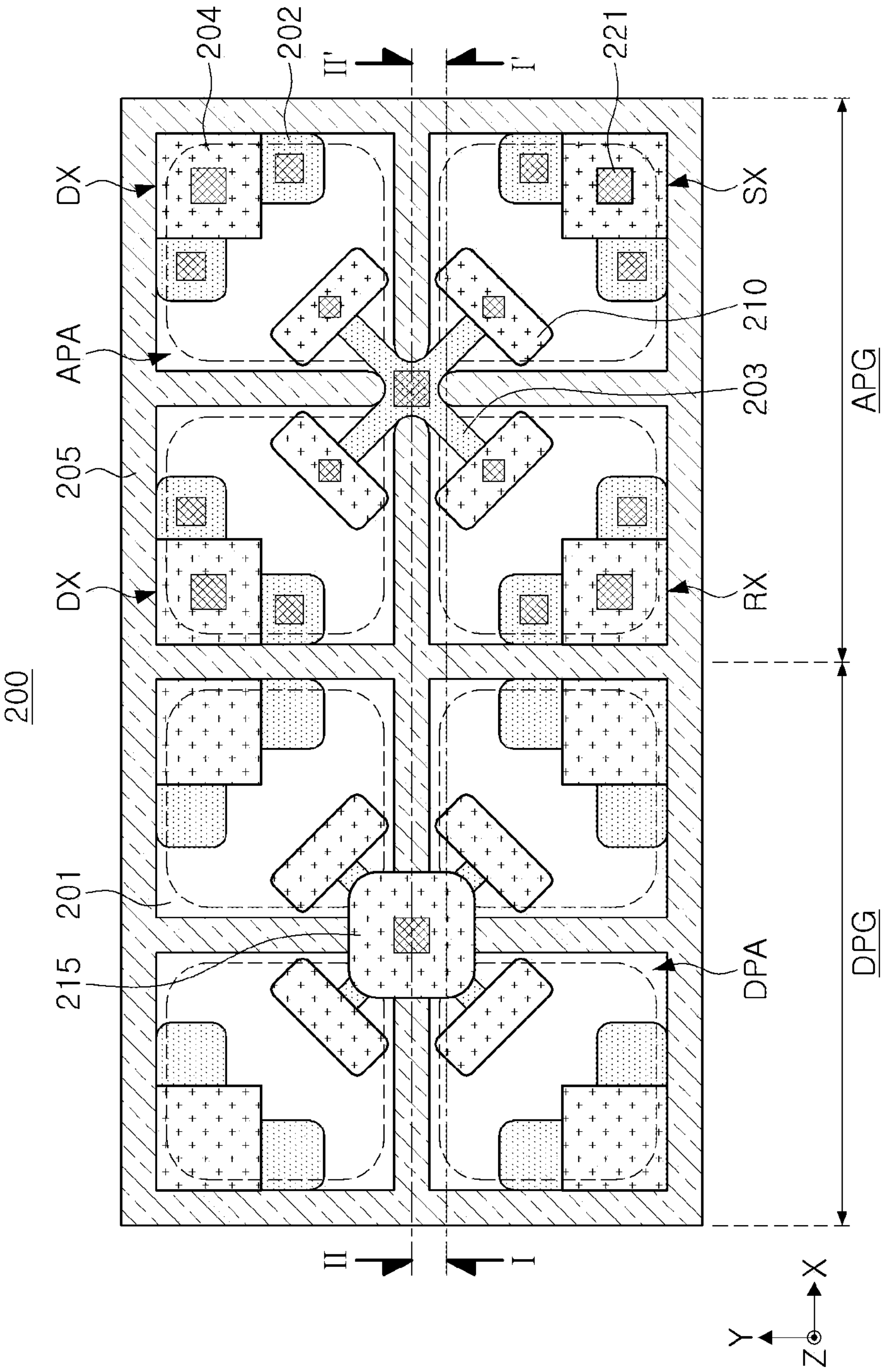
FIG. 6 is a plan view schematically illustrating a portion of an example of a pixel array included in an image sensor.
Figure 7:
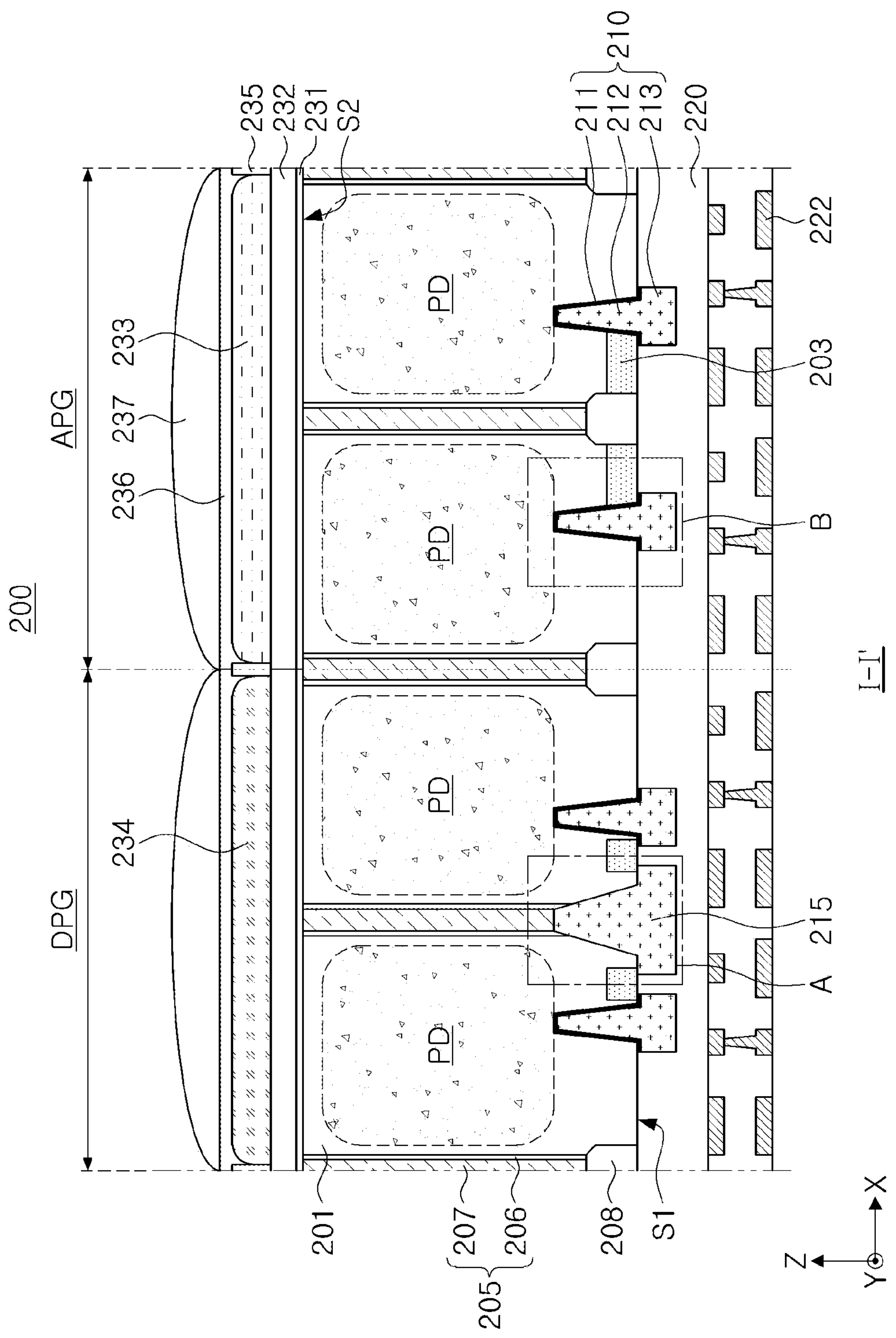
FIG. 7 is a cross-sectional view illustrating a cross-section in a I-I' direction of FIG. 6.
Figure 8:
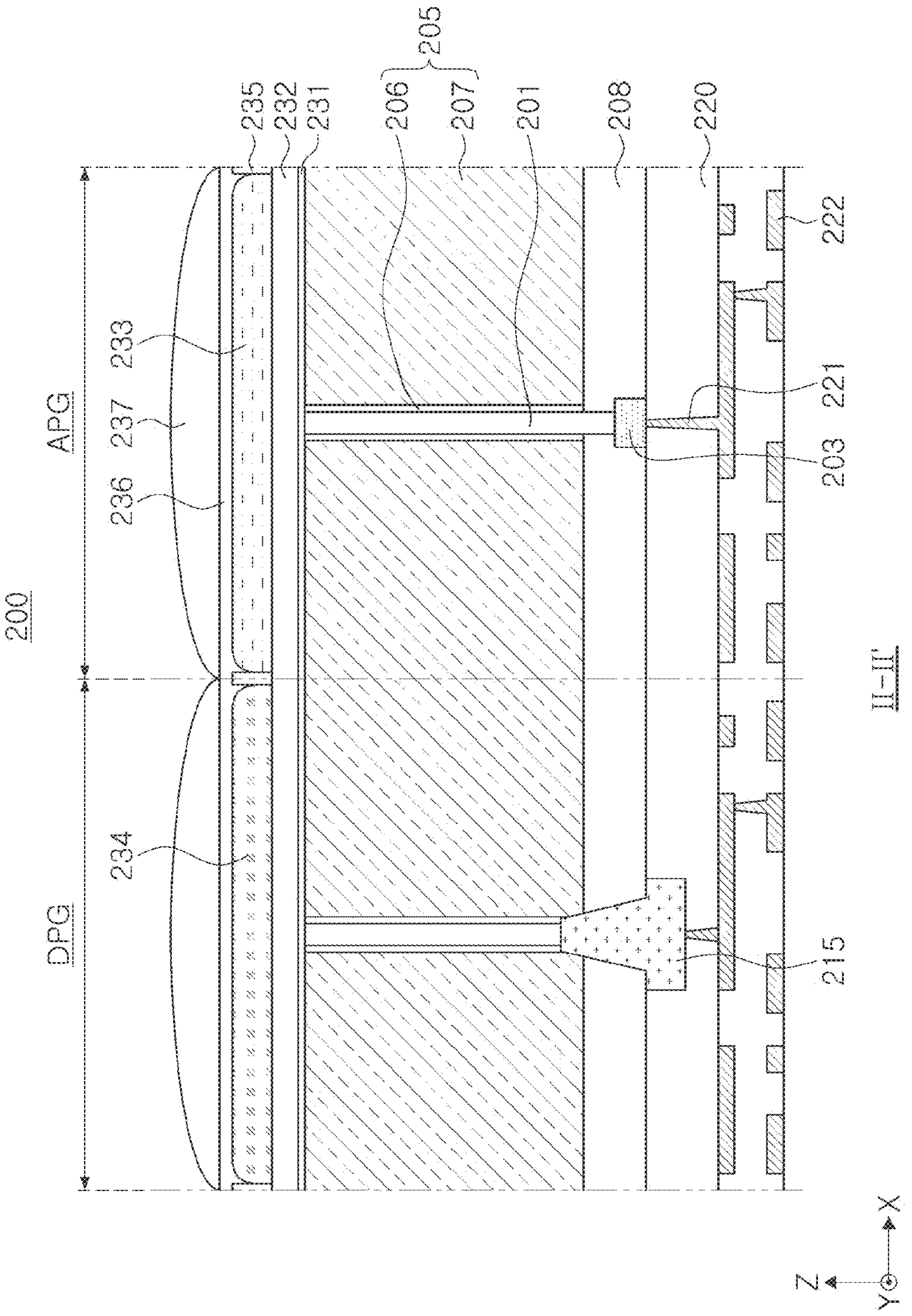
FIG. 8 is a cross-sectional view illustrating a cross-section in a II-II' direction of FIG. 6.

FIG. 6 is a view schematically illustrating a portion of an example of a pixel array (e.g., pixel array 100) included in an image sensor according to some implementations of the present disclosure. FIG. 7 is a cross-sectional view illustrating a cross-section in a I-I' direction of FIG. 6, and FIG. 8 is a cross-sectional view illustrating a cross-section in a II-II' direction of FIG. 6.

A pixel array 200 may include a plurality of pixel regions APA and DPA disposed in the first direction (X-axis direction) and the second direction (Y-axis direction), intersecting each other and parallel to an upper surface of a substrate 201. The plurality of pixel regions APA and DPA may include effective pixel regions APA disposed in an effective region, and dummy pixel regions DPA disposed in a dummy region. The plurality of pixel regions APA and DPA may be separated from each other by a pixel isolation film 205 extending in the first and second directions.

Referring to FIG. 6, effective pixel regions APA disposed in an effective region may be included in an effective pixel group APG, and dummy pixel regions DPA disposed in a dummy region may be included in a dummy pixel group DPG. The effective pixel group APG may include effective pixel regions APA disposed in a 2×2 configuration, and the dummy pixel group DPG may include dummy pixel regions DPA disposed in a 2×2 configuration.

Referring to FIG. 7, a photodiode PD and a transfer gate 210 may be disposed in the effective pixel regions APA and the dummy pixel regions DPA, respectively. As shown in FIGS. 6 to 8, one photodiode PD may be formed in the effective pixel regions APA and the dummy pixel regions DPA, respectively, but the number of photodiodes PD may be two or more, depending on the implementation.

The transfer gate 210 may have a shape digging into or extending into a substrate 201 by a predetermined depth in a third direction (Z-axis direction), perpendicular to a first surface S1 of the substrate 201. Referring to FIG. 7, the transfer gate 210 may include a gate insulating layer 211 and a gate electrode layer (212 and 213), and the gate electrode layer (212 and 213) may include a first electrode region 212 disposed in the substrate 201, and a second electrode region 213 disposed on the first surface S1 of the substrate 201.

A floating diffusion region 203 may be formed in a central portion of a region in which the effective pixel group APG and the dummy pixel group DPG are disposed, respectively. The floating diffusion region 203 may be a region doped with an N-type conductive impurity, and may extend in diagonal directions, intersecting the first and second directions and parallel to the first surface S1 of the substrate 201. The floating diffusion region 203 may be adjacent to transfer gates 210 in the diagonal directions.

Referring to FIG. 7, the transfer gate 210 may be adjacent to the photodiode PD in the substrate 201. Therefore, when a predetermined voltage is applied to the transfer gate 210, charges of the photodiode PD may move to the floating diffusion region 203 along a channel formed around the transfer gate 210.

In the effective pixel regions APA and the dummy pixel regions DPA, a plurality of devices RX, DX, and SX implemented by a plurality of active regions 202 and a plurality of gate structures 204 may be disposed. As shown in FIGS. 6 to 8, one of the devices RX, DX, and SX may be disposed in the effective pixel regions APA and the dummy pixel regions DPA, respectively, but the arrangement, the number, and/or the like of devices RX, DX, and SX may vary from this example.

Referring to FIG. 6, four of the devices RX, DX, and SX may be disposed in the effective pixel group APG and the dummy pixel group DPG, respectively. The devices RX, DX, and SX may include a reset transistor RX, a select transistor SX, and a drive transistor DX. In some implementations, as illustrated in FIGS. 6 to 8, two of the devices RX, DX, and SX may be utilized as drive transistors DX. In some implementations, one of the devices RX, DX, and SX is utilized as a transistor, other than the drive transistor DX. For example, one of the devices RX, DX, and SX may be connected between the reset transistor RX and the floating diffusion region 203 to be utilized for the purpose of controlling capacitance of the floating diffusion region 203.

Referring to FIGS. 7 and 8, a pixel isolation film 205 may be connected to a device isolation film 208 formed close to the first surface S1 of the substrate 201 in the third direction. The pixel isolation film 205 may include a first isolation film 206 and a second isolation film 207, and the second isolation film 207 may be disposed inside the first isolation film 206 in the first and second directions. For example, the second isolation film 207 may be formed of polysilicon, and the first isolation film 206 may be formed of an insulating material, such as silicon oxide or the like.

The device isolation film 208 may be formed of silicon oxide or the like, and may have a length, shorter than a length of the pixel isolation film 205, in the third direction. In addition, as illustrated in FIGS. 7 and 8, in the third direction, a lowermost end of the device isolation film 208 may be located closer to the first surface S of the substrate 201 than is a lowermost end of the first electrode region 212. For example, in the third direction, a thickness of the device isolation film 208 may be smaller than a thickness of the first electrode region 212. For example, in the third direction, an end or surface of the device isolation film 208 opposite the first surface S1 and in the substrate 201 can be closer to the first surface S1 than is an end or surface of the first electrode region 212 opposite the first surface S1 and in the substrate 201.

A horizontal insulating layer (231 and 232) may be disposed on a second surface S2 facing the first surface of the substrate 201. The horizontal insulating layer (231 and 232) may include a first horizontal insulating layer 231 and a second horizontal insulating layer 232, and the first horizontal insulating layer 231 may be formed of a material having a higher permittivity than the second horizontal insulating layer 232. In some implementations, a thickness of the second horizontal insulating layer 232 is greater than a thickness of the first horizontal insulating layer 231.

Color filters 233 and 234 may be disposed on the horizontal insulating layer (231 and 232), and a grid pattern 235 may be disposed between the color filters 233 and 234. The color filters 233 and 234 may allow light of a specific wavelength band to pass through and advance to the photodiode PD. For example, a first color filter 233 may allow light of a green wavelength band to pass through, and a second color filter 234 may allow light of a blue wavelength band to pass through. A planarization layer 236 and a micro lens 237 may be disposed on the color filters 233 and 234.

Contacts 221, interconnection patterns 222, and an interlayer insulating layer 220 may be disposed on the first surface S1 of the substrate 201. The contacts 221 and the interconnection patterns 222 may be disposed in the interlayer insulating layer 220. The contacts 221 may be connected to the floating diffusion region 203, the transfer gate 210, and the devices RX, DX, and SX in the effective pixel regions APA, and may be connected to a vertical structure 215 in the dummy pixel regions DPA. In some implementations, the contacts 221 connected to the floating diffusion region 203, the transfer gate 210, and the devices RX, DX, and SX are not disposed in the dummy pixel regions DPA, e.g., are spaced apart from the dummy pixel regions DPA.

The vertical structure 215 may be disposed in a central portion of the dummy pixel group DPG. The vertical structure 215 may have a shape penetrating or extending to a predetermined depth from the first surface S1 of the substrate 201, and may have a shape similar to the transfer gate 210, for example. In the substrate 201, a depth of the vertical structure 215 may be substantially the same as a depth of the transfer gate 210.

The vertical structure 215 may be formed of the same material as the gate electrode layer (212 and 213), and may be formed of polysilicon, for example. As illustrated in FIGS. 7 and 8, the vertical structure 215 may extend further than a depth of the device isolation film 208 from the first surface S1 in the third direction, and thus may be in direct contact with the second isolation film 207 of the pixel isolation film 205 in the substrate 201. The vertical structure 215 may be in direct contact with the second isolation film 207 in at least one of the first and second directions.

The vertical structure 215 may be connected to a logic circuit of an image sensor through the contact 221 and the interconnection pattern 222, and the logic circuit may apply a predetermined bias voltage to the vertical structure 215. The bias voltage applied by the logic circuit to the vertical structure 215 may be applied to the second isolation film 207. For example, the logic circuit may remove charges generated in the substrate 201 by a cause other than light flowing in from the outside by applying a negative bias voltage to the second isolation film 207. Therefore, a dark current of the image sensor may be reduced and dark level characteristics may be improved.

Since the vertical structure 215 has a shape similar to that of the transfer gate 210, the vertical structure 215 may be formed in the same process as the transfer gate 210. For example, in an etching process for removing a portion of the substrate 201 from the first surface S1 to form the transfer gate 210, the central portion of the dummy pixel group DPG may be etched together. Thereafter, in a process for forming the gate electrode layer (212 and 213), the vertical structure 215 may be formed together. Therefore, the vertical structure 215 may be formed while minimizing an increase in process operations.

Figure 9:
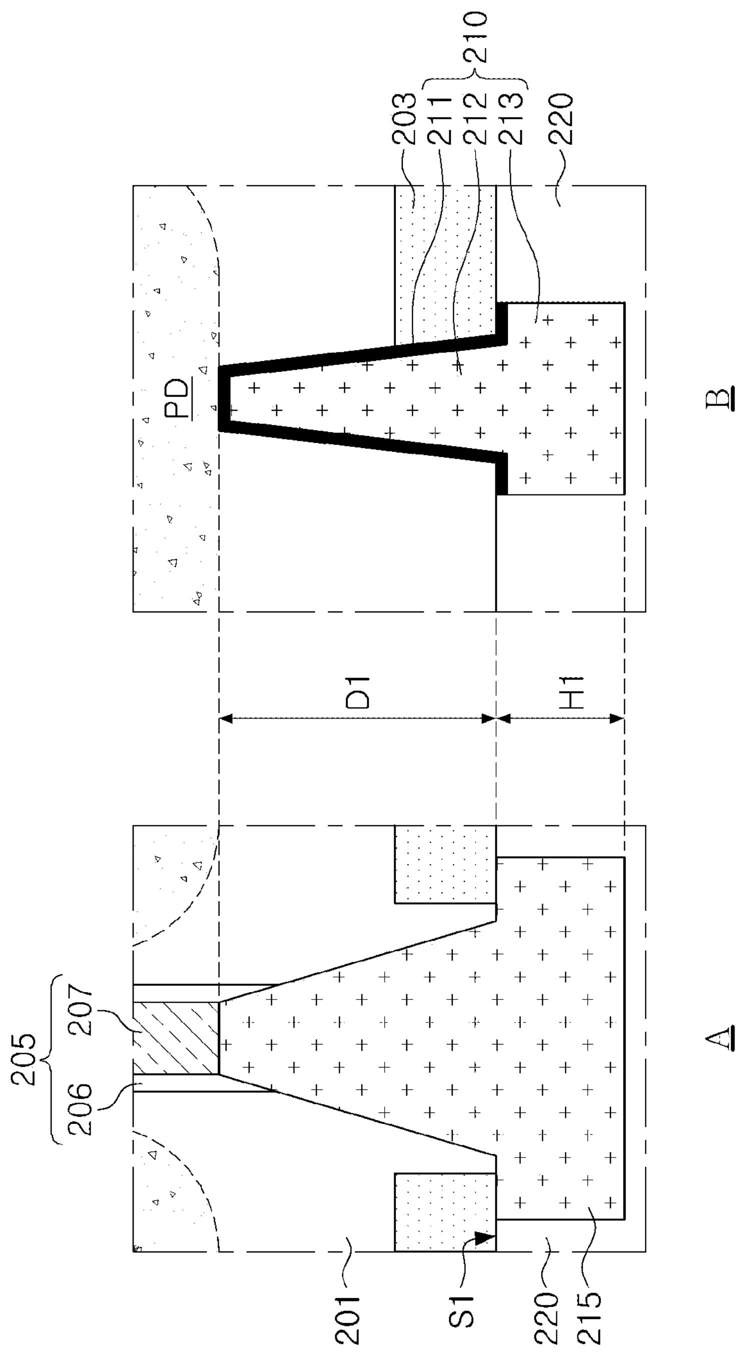
FIG. 9 is an enlarged view illustrating a portion of FIG. 7.

FIG. 9 illustrates enlarged views of portions 'A' and 'B' of FIG. 7. The portion 'A' of FIG. 7 may correspond to a region in which the vertical structure 215 is disposed, and the portion 'B' of FIG. 7 may correspond to a region in which the transfer gate 210 is disposed.

As described above, the vertical structure 215 and the transfer gate 210 may have similar shapes. The transfer gate 210 may include the gate insulating layer 211 and the gate electrode layer (212 and 213), and the gate electrode layer (212 and 213) may include the first electrode region 212 embedded in the substrate 201, and the second electrode region 213 disposed on the first surface S1 of the substrate 201. The gate insulating layer 211 and the first electrode region 212 may be adjacent to the photodiode PD in the substrate 201.

The vertical structure 215 may be in contact with the pixel isolation film 205 in the substrate 201. Referring to FIG. 9, a portion of the vertical structure 215 may be in direct contact with the second isolation film 207 in the substrate 201. For example, a portion of a surface of the vertical structure 215 in the substrate 201 may be in direct contact with the second isolation film 207. Additionally, a portion of the vertical structure 215 may also be in direct contact with the first isolation film 206.

Referring to FIG. 9, in the third direction (Z-axis direction), perpendicular to the first surface S1 of the substrate 201, a lowermost end of the transfer gate 210 (e.g., an end of the transfer gate 210 opposite the first surface S1 and in the substrate 201) and a lowermost end of the vertical structure 215 (e.g., an end of the vertical structure opposite the first surface S1 and in the substrate 201) may be located at substantially the same depth D1 from the first surface S1 of the substrate 201. This may be because etching processes for forming the vertical structure 215 and the transfer gate 210 are performed simultaneously, e.g., as the same etching process.

In addition, in the third direction, an upper surface of the transfer gate 210 (e.g., a surface of the transfer gate 210 opposite the first surface S1 and disposed outside the substrate 201) and an upper surface of the vertical structure 215 (e.g., a surface of the vertical structure 215 opposite the first surface S1 and disposed outside the substrate 201) may be located at substantially the same height H1. This may be because the vertical structure 215 and the gate electrode layer (212 and 213) are formed together in a single process using polysilicon, e.g., as the same deposition process.

Figure 10:
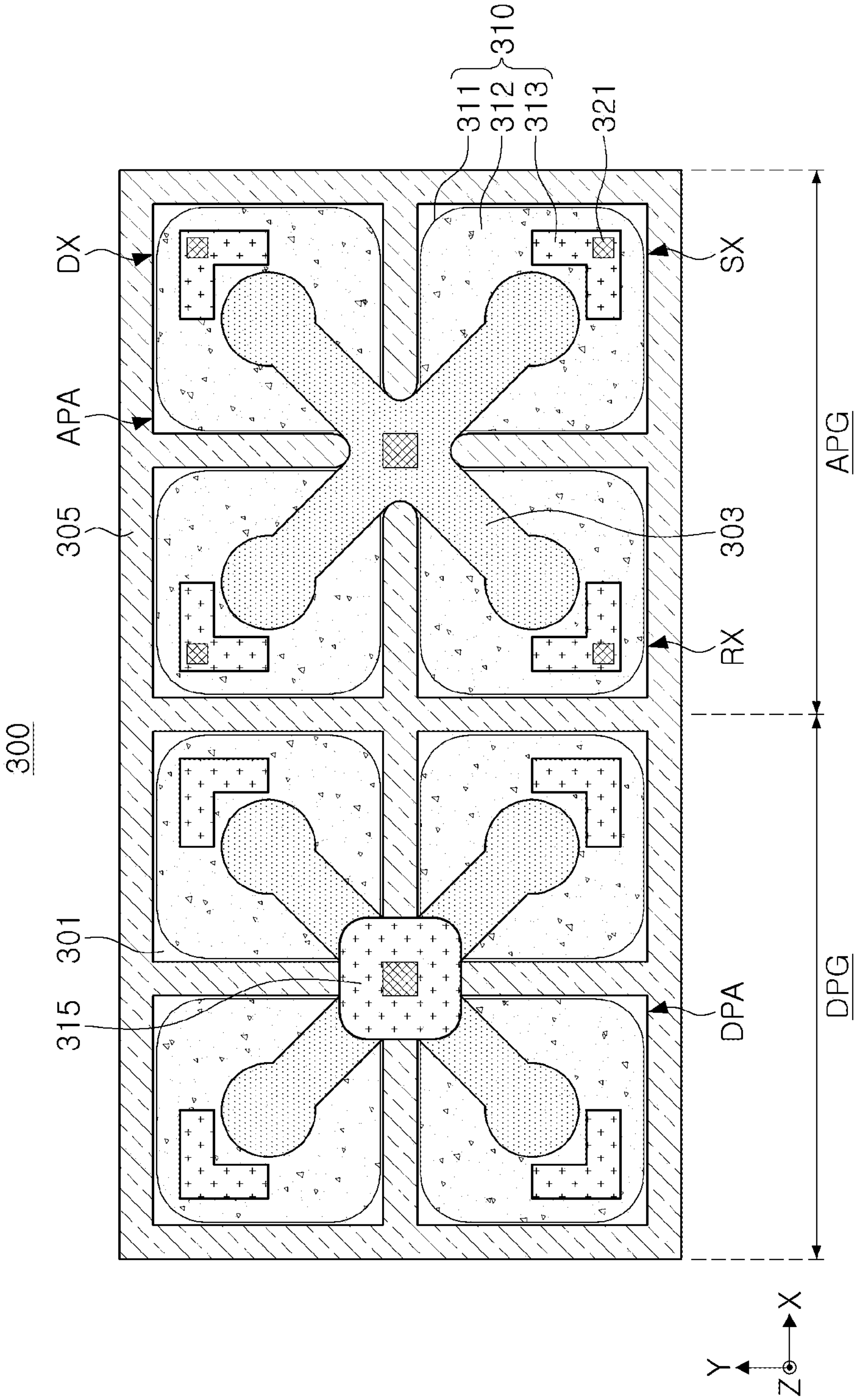
FIG. 10 is a plan view schematically illustrating a portion of an example of a pixel array included in an image sensor.

FIG. 10 is a view schematically illustrating a portion of an example of a pixel array included in an image sensor. A pixel array 300 (e.g., pixel array 100) as illustrated in FIG. 10 may include a plurality of pixel regions APA and DPA separated by a pixel isolation film 305 extending in the first direction (X-axis direction) and the second direction (Y-axis direction), intersecting each other and parallel to an upper surface of a substrate 301. The plurality of pixel regions APA and DPA may include effective pixel regions APA disposed in an effective region and dummy pixel regions DPA disposed in a dummy region.

Referring to FIG. 10, the effective pixel regions APA disposed in the effective region may be included in an effective pixel group APG, and the dummy pixel regions DPA disposed in the dummy region may be included in a dummy pixel group DPG. A photodiode and a transfer gate 310 may be disposed in the effective pixel regions APA and the dummy pixel regions DPA, respectively.

The transfer gate 310 may have a shape digging into or extending into the substrate 301 by a predetermined depth in the third direction (Z-axis direction), perpendicular to one surface of the substrate 301. Referring to FIG. 10, the transfer gate 310 may include a gate insulating layer 311 and a gate electrode layer (312 and 313), and a first electrode region 312 may be disposed in the substrate 301, and a second electrode region 313 may be disposed on the one surface of the substrate 301.

A floating diffusion region 303 may be formed in a central portion of a region in which the effective pixel group APG and the dummy pixel group DPG are disposed, respectively, and may extend in a diagonal direction, intersecting the first and second directions. The floating diffusion region 303 may be formed to be surrounded by the transfer gate 310 in each of the plurality of pixel regions APA and DPA. For example, in each of the pixel regions APA and DPA, the first electrode region 312 may surround the floating diffusion region 303. A plurality of contacts 321 may be connected to the floating diffusion region 303 and the second electrode region 313.

In some implementations, as shown in FIG. 10, other devices, except for the transfer gate 310, the floating diffusion region 303, and the photodiode, may not be formed in each of the plurality of pixel regions APA and DPA. Other devices for implementing a pixel circuit, such as a reset transistor, a drive transistor, a select transistor, or the like, may be formed on a different substrate provided separately from the substrate 301, and may be then bonded to the substrate 301 by Cu—Cu bonding, hybrid bonding, or the like to provide the pixel array. The hybrid bonding may be a method of using an insulating layer formed of silicon carbon nitride (SiCN) or the like around pads for bonding, in addition to bonding between pads formed of conductive materials such as copper or the like. For example, a reset transistor, a drive transistor, a select transistor, or the like may be formed in a region of a different substrate corresponding to the effective pixel group APG, to implement the effective pixel group APG as a pixel circuit, as described above with reference to FIG. 5.

A vertical structure 315 may be disposed in a central portion of the dummy pixel group DPG, and therefore, a portion of the floating diffusion region 303 may be removed in the central portion of the dummy pixel group DPG. The vertical structure 315 may have a shape penetrating or extending to a predetermined depth from one surface of the substrate 301, and may have a shape similar to the transfer gate 310, for example. In the substrate 301, a depth of the vertical structure 315 may be substantially the same as a depth of the transfer gate 310.

The vertical structure 315 may be formed of the same material as the gate electrode layer (312 and 313), and may be formed of, for example, polysilicon. The vertical structure 315 may be connected to the pixel isolation film 305 in the substrate 301, and may be in direct contact with an isolation film disposed relatively inside among the plurality of isolation films included in the pixel isolation film 305, and formed of polysilicon.

The vertical structure 315 may be connected to a logic circuit of an image sensor through a contact 321, and may provide a path for transmitting a bias voltage applied from the logic circuit to the pixel isolation film 305. The logic circuit may remove charges generated in the substrate 301 by causes other than externally introduced light by applying a negative bias voltage to the vertical structure 315. Therefore, a dark current of the image sensor may be reduced and dark level characteristics may be improved. As previously described with reference to FIGS. 6 to 8, the vertical structure 315 may be formed together with the transfer gate 310 in the same process.

Figure 11:
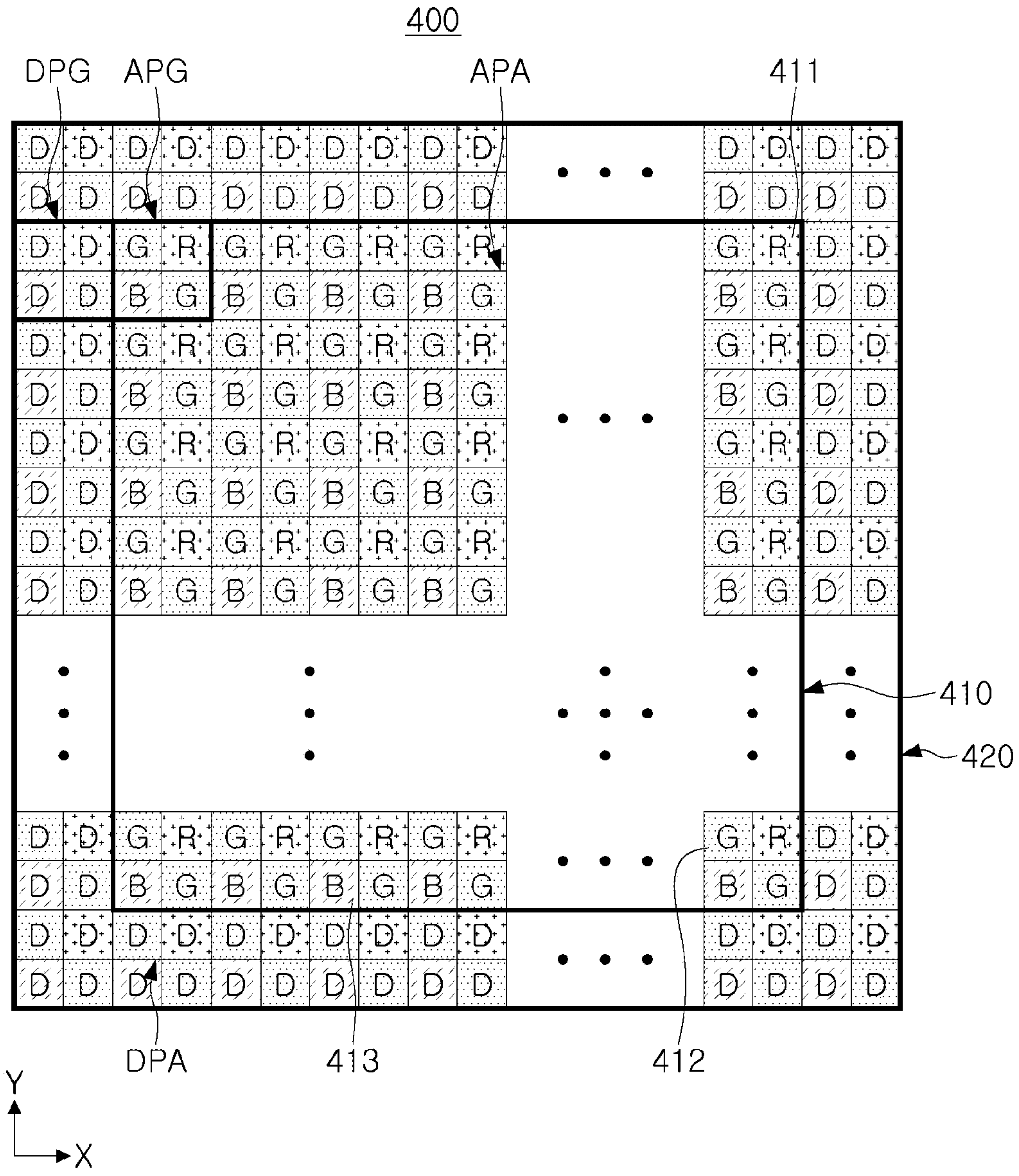
FIG. 11 is a plan view schematically illustrating an example of a pixel array included in an image sensor.
Figure 12:
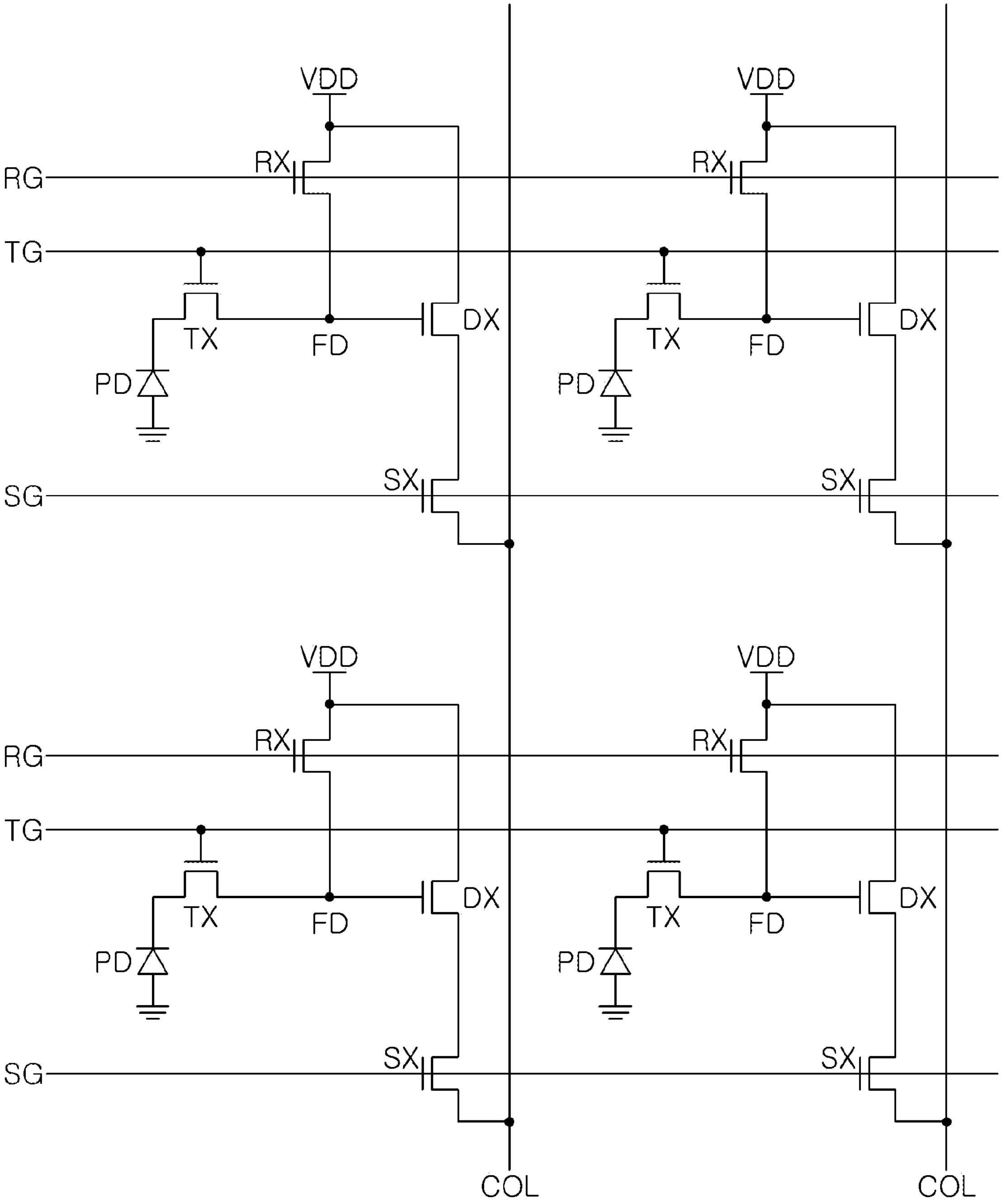
FIG. 12 is a circuit diagram illustrating an example of a pixel circuit included in an image sensor.

FIG. 11 is a view schematically illustrating an example of a pixel array included in an image sensor. FIG. 12 is a circuit diagram illustrating an example of a pixel circuit included in an image sensor, e.g., a pixel circuit in the pixel array of FIG. 11.

First, referring to FIG. 11, a pixel array 400 may include a plurality of pixel regions APA and DPA disposed in the first direction (X-axis direction) and the second direction (Y-axis direction). The plurality of pixel regions APA and DPA may include effective pixel regions APA disposed in an effective region 410, and dummy pixel regions DPA disposed in a dummy region 420. In some implementations, as shown in FIG. 11, the dummy region 420 is disposed around the effective region 410, but the dummy pixel regions DPA may additionally or alternatively be disposed in the first or second direction between at least some of the effective pixel regions APA.

The plurality of pixel regions APA and DPA may be divided into a red pixel region 411, a green pixel region 412, and a blue pixel region 413, depending on a type of color filter disposed in each. At least some of the pixel regions APA and DPA may not include a color filter transmitting light only in a certain wavelength band.

In the pixel array 400, each of the plurality of pixel regions APA and DPA may include a photodiode and devices electrically connected to the photodiode to provide a pixel circuit. Unlike some implementations of the pixel array illustrated in FIG. 4, two or more adjacent pixel regions APA and DPA may not be grouped into one pixel group, and each of the pixel regions APA and DPA may provide an individual pixel. In order for each of the pixel regions APA and DPA to provide an individual pixel, a floating diffusion region may be formed in each of the pixel regions APA and DPA.

A vertical structure contacting a pixel isolation film may be disposed in the dummy region 420. In some implementations, the vertical structure is disposed between at least some of the dummy pixel regions DPA. The vertical structure may have a shape digging into or extending into a substrate by a predetermined depth, and may provide a transmission path of a bias voltage for removing charges generated in the substrate by directly contacting the pixel isolation film in the substrate.

FIG. 12 is a pixel circuit diagram of a pixel PX provided by each of the effective pixel regions APA included in the pixel array 400 of FIG. 11. Referring to FIG. 12, an individual pixel PX may include a photodiode PD, a transfer transistor TX, a floating diffusion region FD, a reset transistor RX, a drive transistor DX, and a select transistor SX. Components included in the pixel PX may be disposed in each of the effective pixel regions APA described with reference to FIG. 11.

Figure 13:
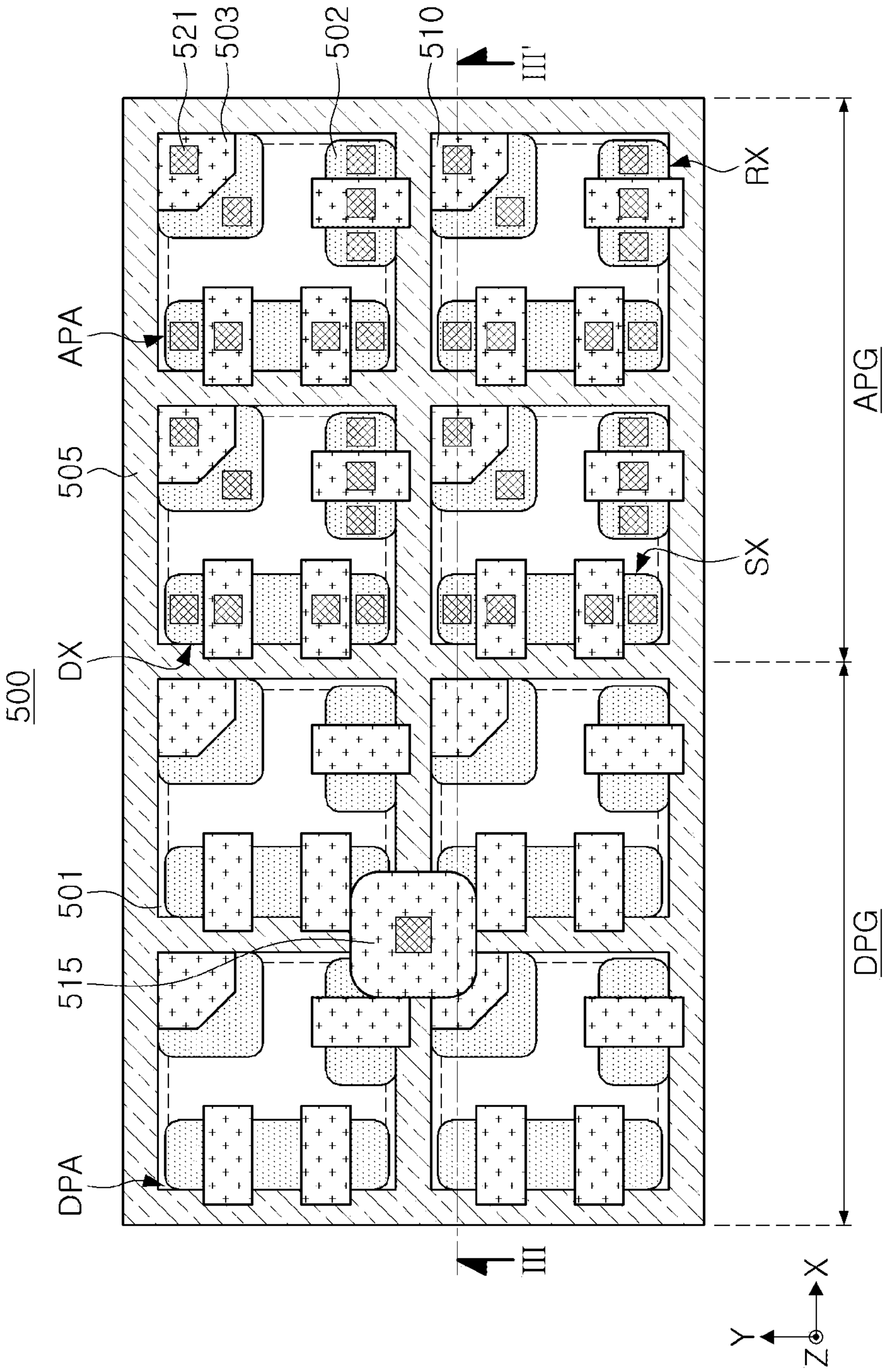
FIG. 13 is a plan view schematically illustrating a portion of an example of a pixel array included in an image sensor.
Figure 14:
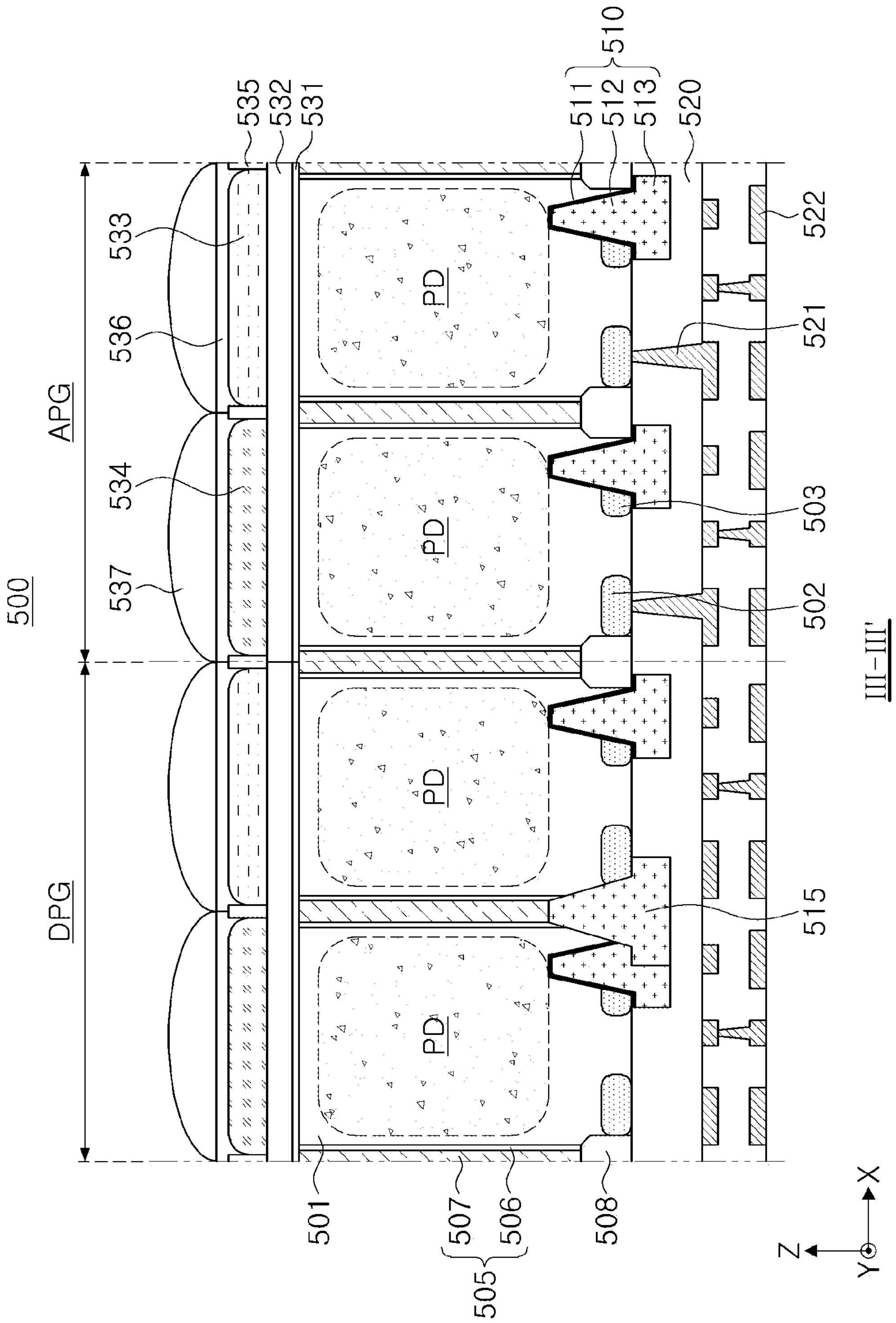
FIG. 14 is a cross-sectional view illustrating a cross-section in a III-III' direction of FIG. 13.

FIG. 13 is a view schematically illustrating a portion of an example of a pixel array (e.g., pixel array 400) included in an image sensor. FIG. 14 is a cross-sectional view illustrating a cross-section in a III-III' direction of FIG. 13.

As shown in FIG. 13, a pixel array 500 may include a pixel isolation film 505 extending in the first direction (X-axis direction) and the second direction (Y-axis direction), intersecting each other and parallel to an upper surface of a substrate 501. The pixel isolation film 505 may include a first isolation film 506 and a second isolation film 507 disposed inside the first isolation film 506, and may be connected to a device isolation film 508 in a region close to a first surface S1 of the substrate 501. A plurality of pixel regions APA and DPA may be separated from each other by the pixel isolation film 505. For example, the first isolation film 506 may be formed of an insulating material such as silicon oxide or the like, and the second isolation film 507 may be formed of a conductive material such as polysilicon or the like.

The plurality of pixel regions APA and DPA may include effective pixel regions APA disposed in an effective region, and dummy pixel regions DPA disposed in a dummy region. Referring to FIGS. 13 and 14, a photodiode PD, active regions 502, a floating diffusion region 503, gate structures 504, and a transfer gate 510 may be disposed in the effective pixel regions APA and the dummy pixel regions DPA, respectively. The active regions 502 and the gate structures 504 may provide a reset transistor RX, a drive transistor DX, and a select transistor SX, included in a pixel circuit. In some implementations, as shown in FIGS. 13 and 14, the reset transistor RX, the drive transistor DX, and the select transistor SX are disposed in the plurality of pixel regions APA and DPA, respectively.

The transfer gate 510 may have a shape buried by a predetermined depth from the first surface S1 of the substrate 501. The transfer gate 510 may include a gate insulating layer 511 and a gate electrode layer (512 and 513), and the gate electrode layer (512 and 513) may include a first electrode region 512 buried inside the substrate 501, and a second electrode region 513 disposed on the first surface S1 in the third direction (Z-axis direction), perpendicular to the first surface S1.

A horizontal insulating layer (531 and 532), color filters 533 and 534, a grid pattern 535, a planarization layer 536, a micro lens 537, and the like may be disposed on a second surface S2 of the substrate 501. Contacts 521, interconnection patterns 522, and an interlayer insulating layer 520 may be disposed on the first surface S1 of the substrate 501. The contacts 521 may be connected to the floating diffusion region 503, the transfer gate 510, and the devices RX, DX, and SX in the effective pixel regions APA, and may be connected to a vertical structure 515 in the dummy pixel regions DPA. In some implementations, the floating diffusion region 503, the transfer gate 510, and the devices RX, DX, and SX, disposed in the dummy pixel regions DPA, may not be connected to the contacts 521, e.g., may be disconnected from the contacts 521.

The vertical structure 515 may be disposed between at least some of the dummy pixel regions DPA. The vertical structure 515 may be formed of a conductive material such as polysilicon or the like, and may have a shape penetrating or extending to a predetermined depth from the first surface S1 of the substrate 501 similarly to the transfer gate 510. The vertical structure 515 may be in direct contact with the pixel isolation film 505 in the substrate 501. The vertical structure 515 may be in contact with at least one of the active regions 502, the floating diffusion region 503, the transfer gate 510, or the gate structures 504, formed in the dummy pixel regions DPA, in at least one of the first and second directions.

The vertical structure 515 may be formed together with the transfer gate 510. For example, in an etching process for removing a predetermined region from the first surface S1 of the substrate 501, a region in which the transfer gate 510 is to be formed and a region in which the vertical structure 515 is to be formed may be etched together. In this case, a depth of etching the substrate 501 may be greater than a depth of the device isolation film 508, and thus, the vertical structure 515 may be in contact with the pixel isolation film 505 in the substrate 501. The vertical structure 515 may be in contact with the device isolation film 508 in the first direction and the second direction.

In some implementations, as illustrated in FIGS. 13 and 14, the vertical structure 515 is disposed at a point at which the pixel isolation film 505 extending in the first direction and the pixel isolation film 505 extending in the second direction intersect each other, but the arrangement of the vertical structure 515 is not limited to this form. For example, the vertical structure 515 may be located between at least some of the dummy pixel regions DPA to contact the second isolation film 507 of the pixel isolation film 505.

FIGS. 15 to 27 are views illustrating an example of a method of manufacturing an image sensor. For example, the method of FIGS. 15 to 27 can be applied to the pixel arrays and image sensors described with respect to FIGS. 1 to 14.

Figure 15:
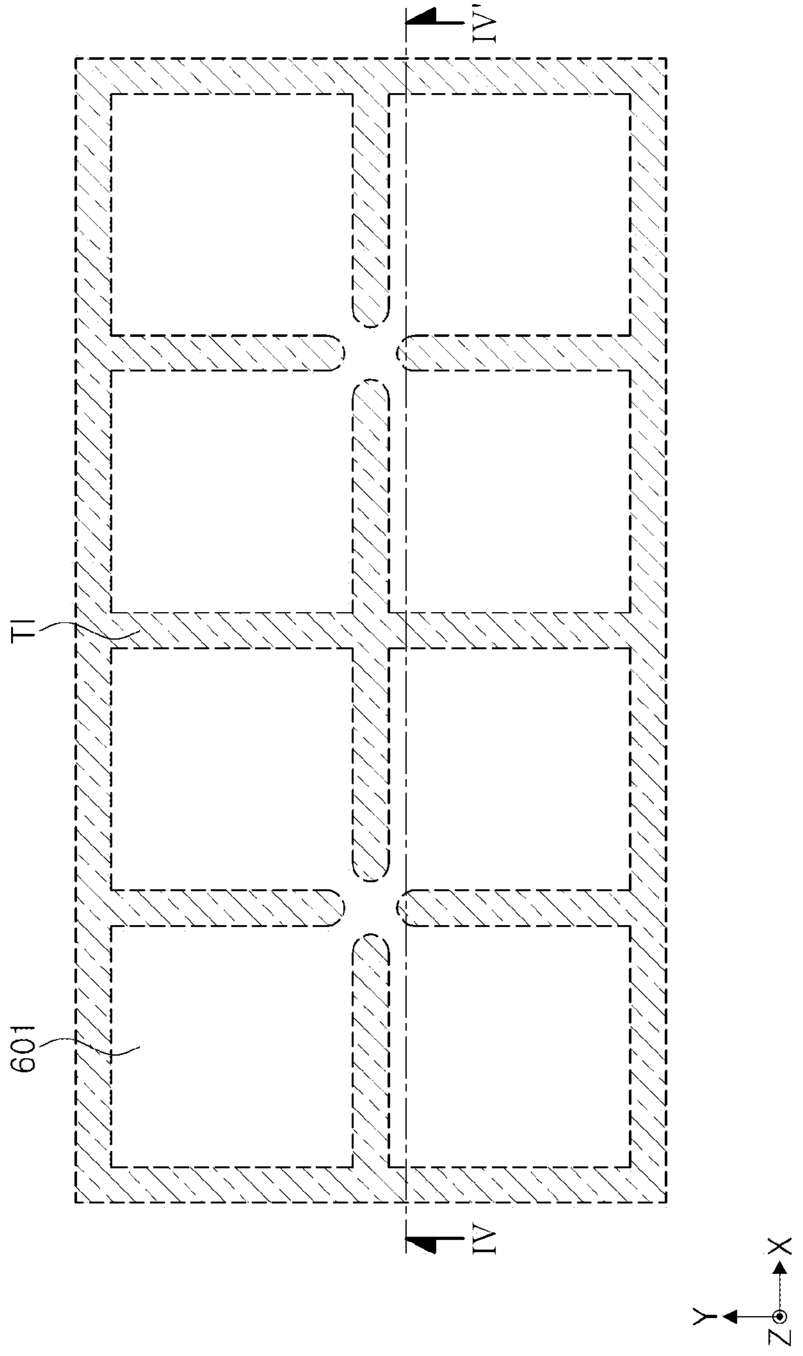
FIGS. 15 to 27 are views illustrating an example of a method of manufacturing an image sensor.
Figure 16:
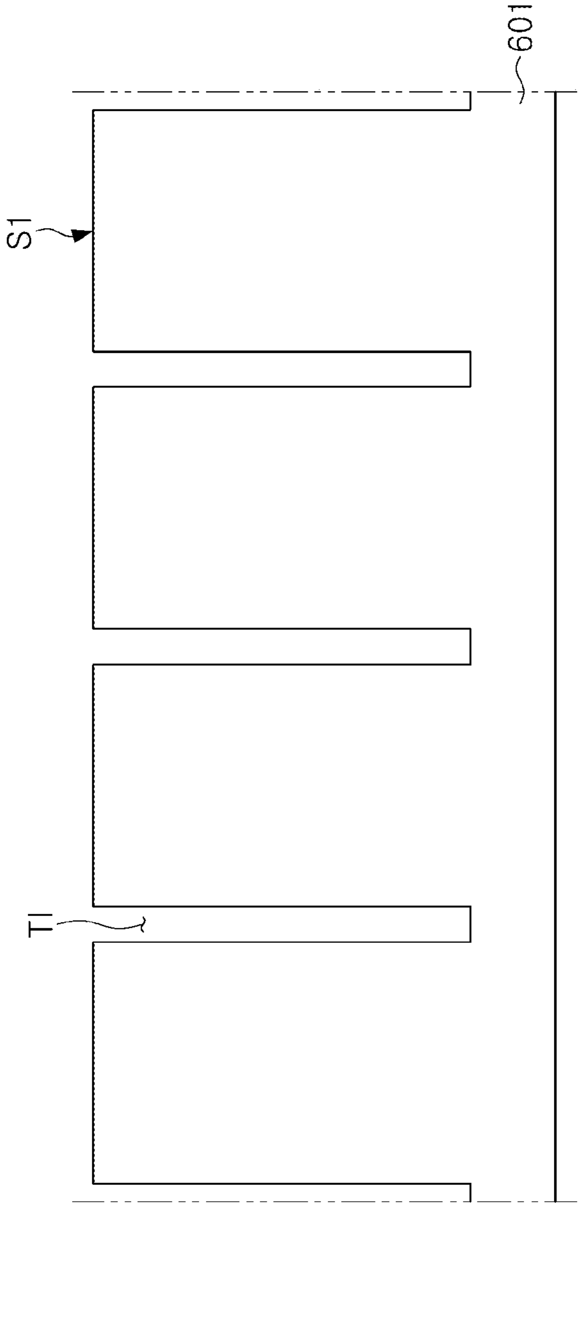

First, referring to FIGS. 15 and 16, a method of manufacturing an image sensor may begin by forming a trench TI extending in the first direction (X-axis direction) and the second direction (Y-axis direction), intersecting each other and parallel to an upper surface of a substrate 601. The trench TI may be formed by an etching process of removing the substrate 601 from a first surface S1 of the substrate 601 by a predetermined depth. Referring to FIG. 16, which illustrates a cross-section in a IV-IV' direction of FIG. 15, a depth of the trench TI may be smaller than a thickness of the substrate 601.

Figure 17:
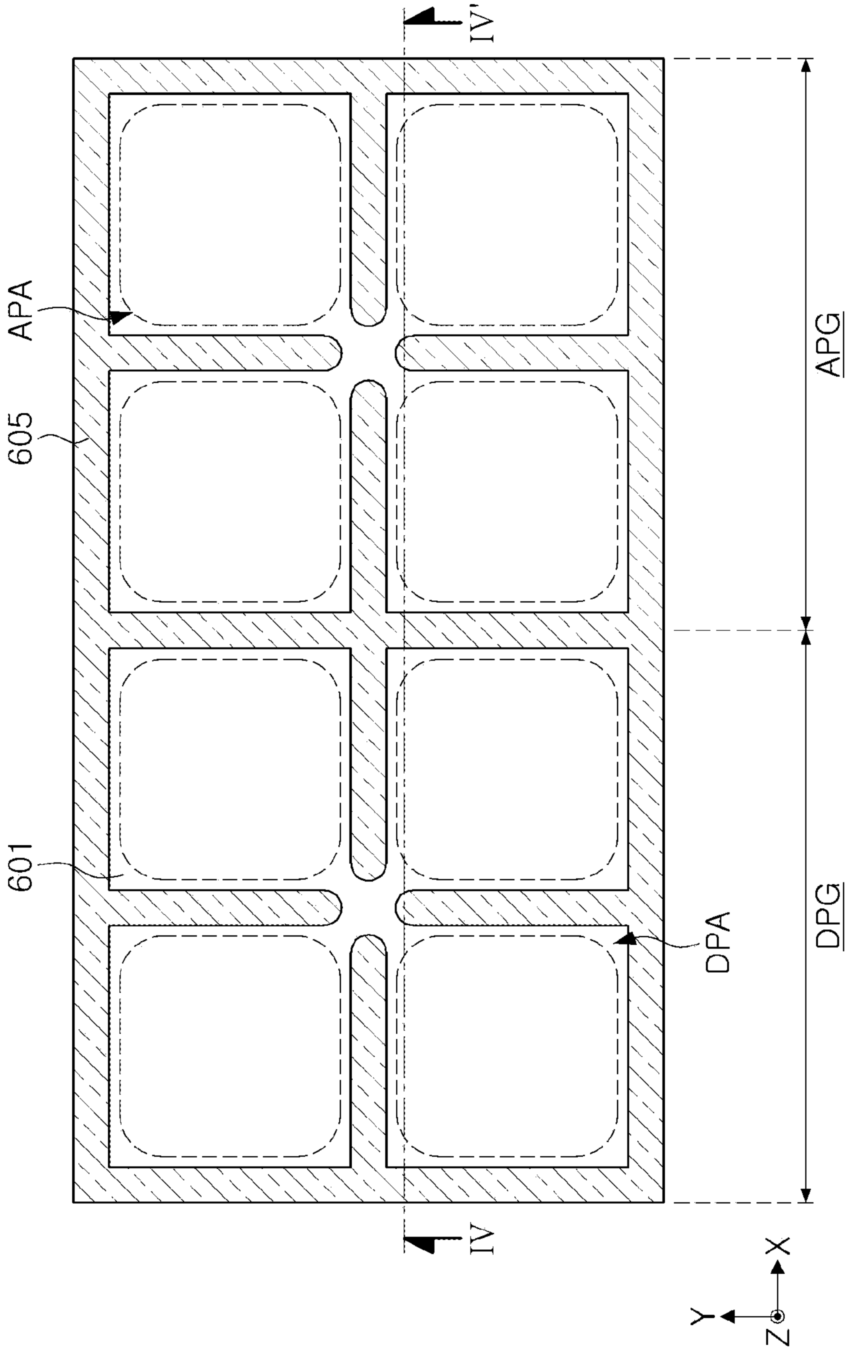
Figure 18:
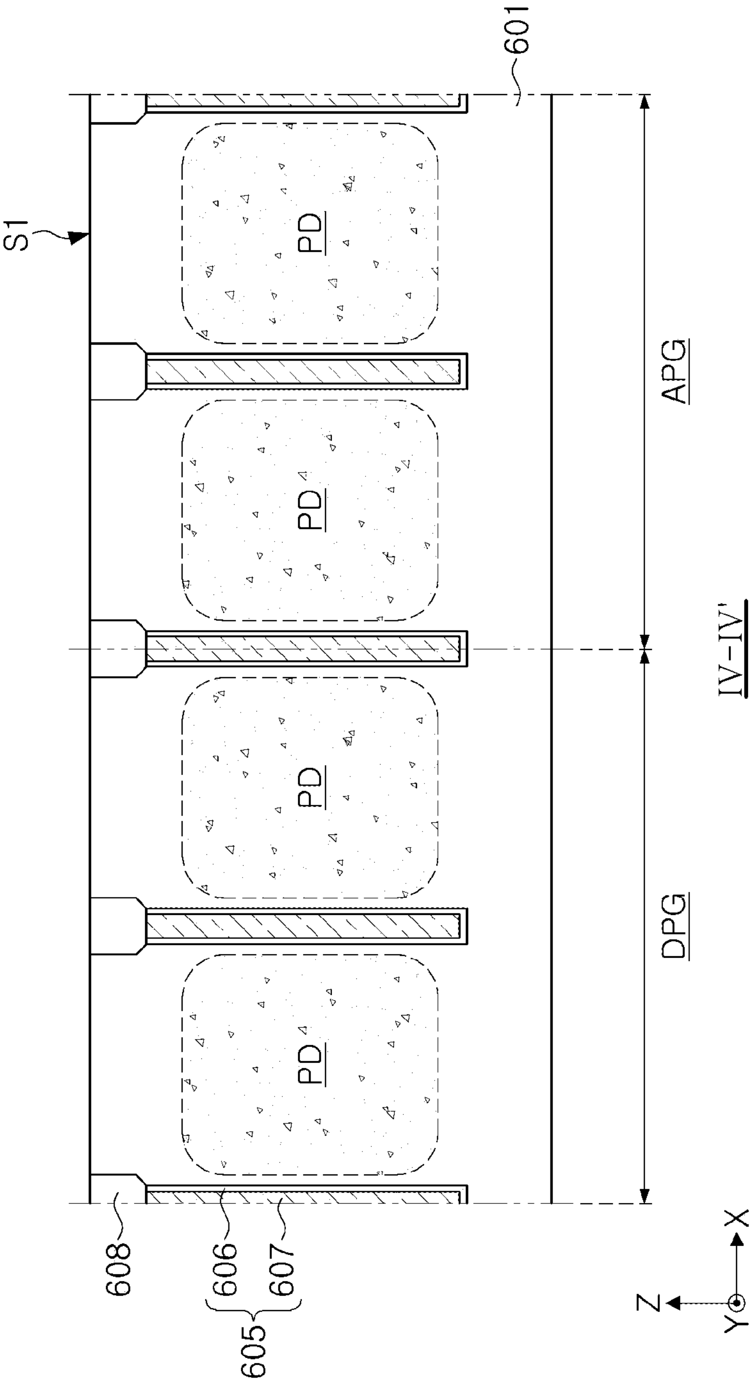

Referring to FIGS. 17 and 18, a pixel isolation film 605, a device isolation film 608, and photodiodes PD may be formed. For example, an insulating material such as silicon oxide or the like may be deposited on an internal surface of the trench TI to form a first isolation film 606, and an internal space of the first isolation film 606 may be filled with a conductive material such as polysilicon or the like to form a second isolation film 607. In this process, a void may be formed in the second isolation film 607. The device isolation film 608 may be formed on the pixel isolation film 605 using silicon oxide or the like, and, in some implementations, the device isolation film 608 has a width, greater than a width of the pixel isolation film 605 in at least one of the first and second directions.

The photodiodes PD may be disposed in a plurality of pixel regions APA and DPA defined by the pixel isolation film 605. The photodiodes PD may be formed by a process of injecting impurities into an internal space of the substrate 601, and, in some implementations, two or more photodiodes PD are disposed in at least one of the plurality of pixel regions APA and DPA.

The plurality of pixel regions APA and DPA may include effective pixel regions APA and dummy pixel regions DPA. Two or more effective pixel regions APA adjacent in the first and second directions may provide one effective pixel group APG, and two or more dummy pixel regions DPA adjacent in the first and second directions may provide one dummy pixel group DPG. As illustrated in FIG. 17, the pixel isolation film 605 and the device isolation film 608 may not be formed in some regions near a central portion of each of the effective pixel group APG and the dummy pixel group DPG.

Figure 19:
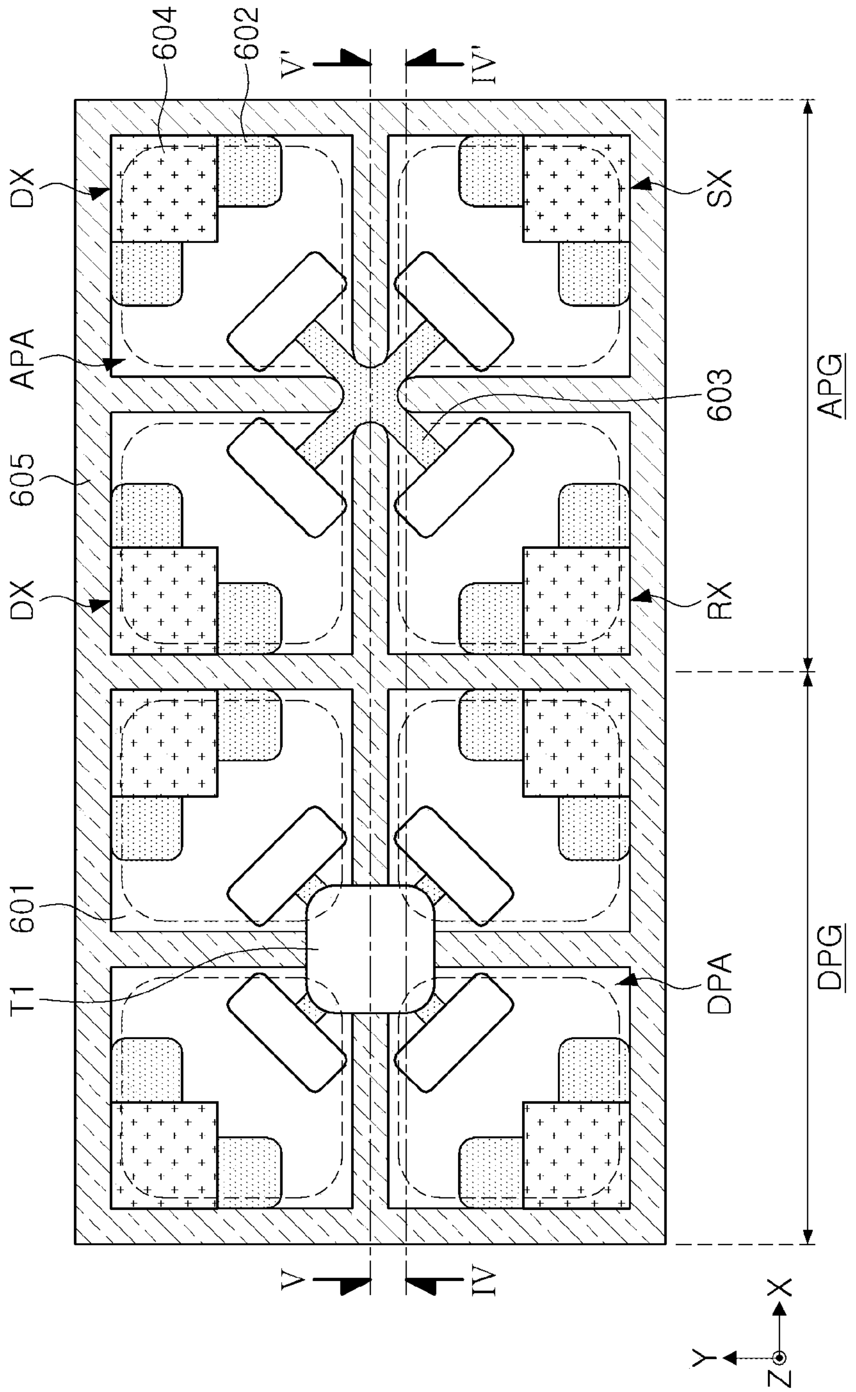
Figure 20:
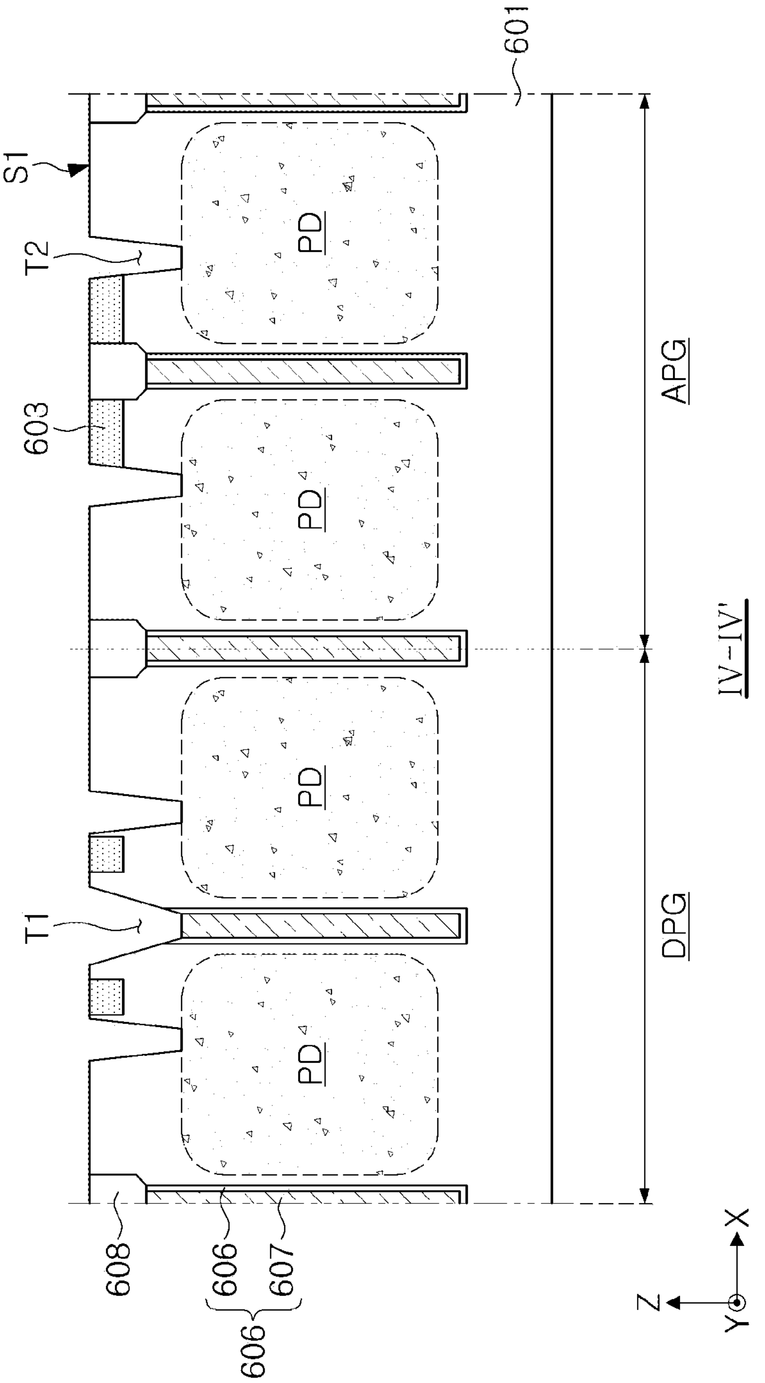
Figure 21:
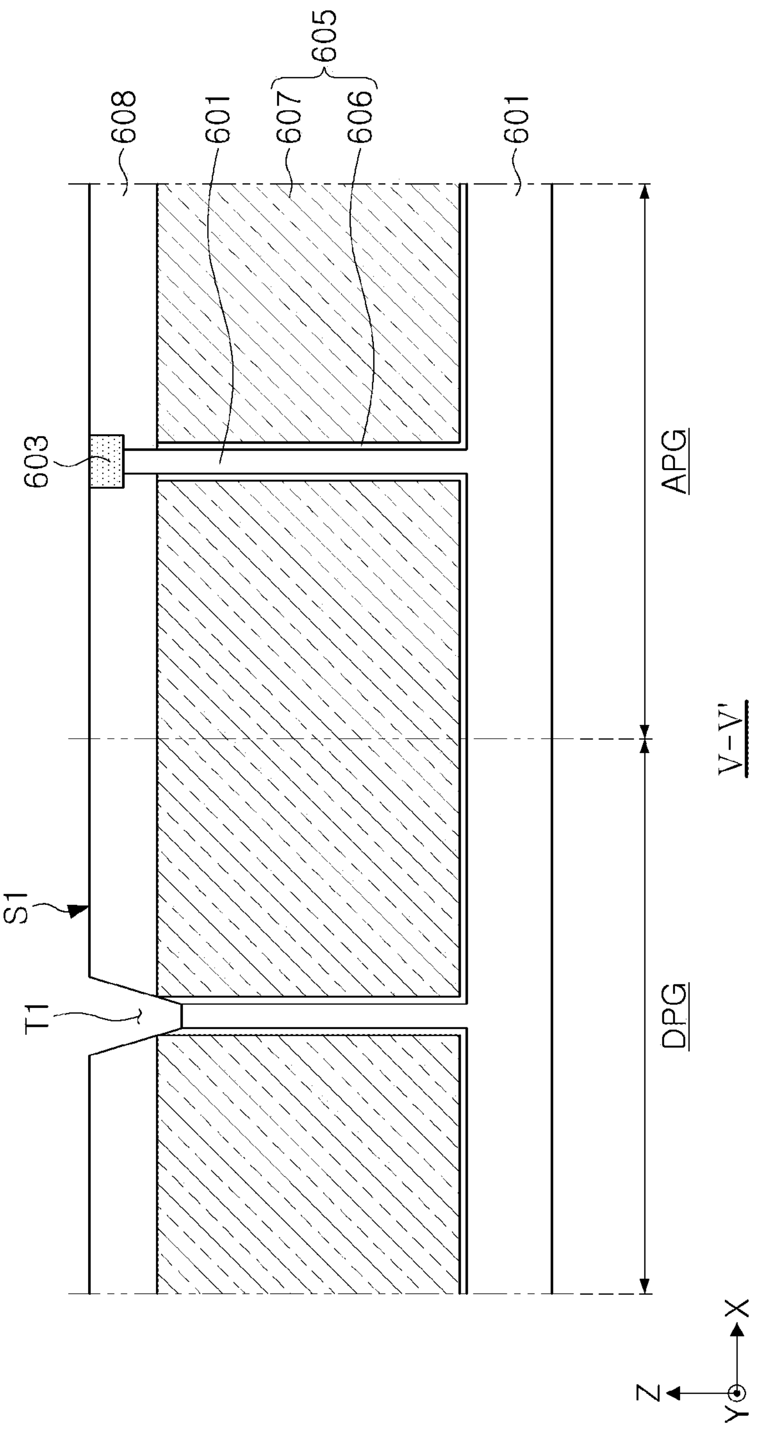

Next, referring to FIGS. 19 to 21, active regions 602, floating diffusion regions 603, gate structures 604, and the like may be formed in the plurality of pixel regions APA and DPA. Each of the floating diffusion regions 603 may be formed by injecting impurities into a region in which the pixel isolation film 605 and the device isolation film 608 are not formed in the effective pixel group APG and the dummy pixel group DPG. The active regions 602 and the gate structures 604 may provide a reset transistor RX, a drive transistor DX, a select transistor SX, and the like, included in a pixel circuit.

A first trench T1 may be formed in the floating diffusion region 603 formed in the dummy pixel group DPG, and a second trench T2 may be formed in a region adjacent to the floating diffusion regions 603 in each of the plurality of pixel regions APA and DPA. The first trench T1 and the second trench T2 may be formed simultaneously in one etching process. As illustrated in FIGS. 20 and 21, the first trench T1 and the second trench T2 may have a predetermined depth extending from the first surface S1 of the substrate 601, and a depth of the first trench T1 and a depth of the second trench T2 may be substantially equal to each other (may match each other).

When the first isolation film 606 is formed of silicon oxide, the first isolation film 606 may have a predetermined etching selectivity with respect to the substrate 601 including silicon. Therefore, during the etching process, at least a portion of the first isolation film 606 may be removed to expose the second isolation film 607. Referring to FIG. 21, which illustrates a cross-section in a V-V' direction of FIG. 19, a portion of the pixel isolation film 605 may be exposed externally by the first trench T1 formed in the dummy pixel region DPG. For example, a portion of the second isolation film 607 included in the pixel isolation film 605 may be exposed externally by a portion of a sidewall of the first trench T1. The first trench T1 may be formed to have a depth greater than a thickness of the device isolation film 608, such that a portion of the second isolation film 607 may be exposed externally.

Figure 22:
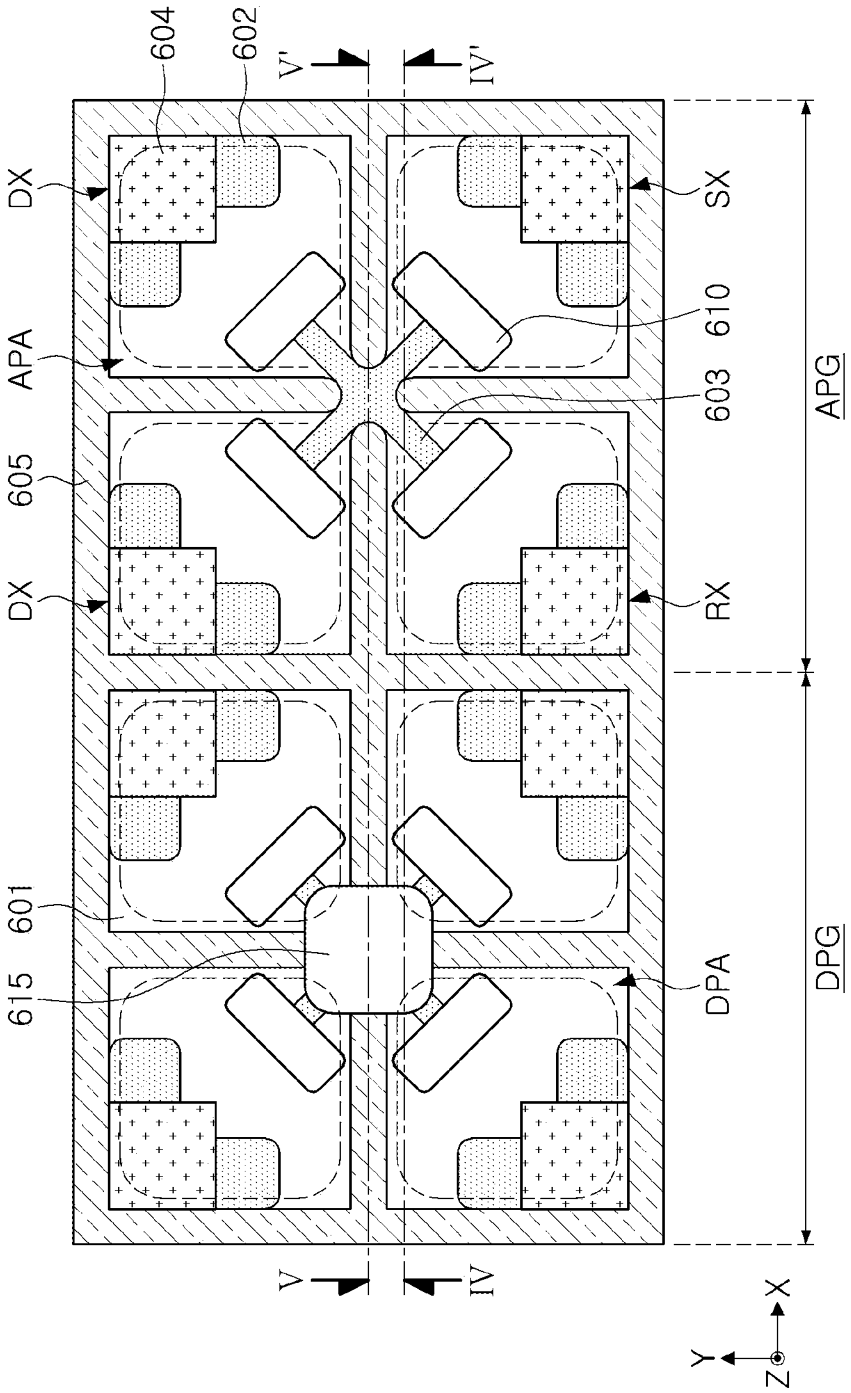
Figure 23:
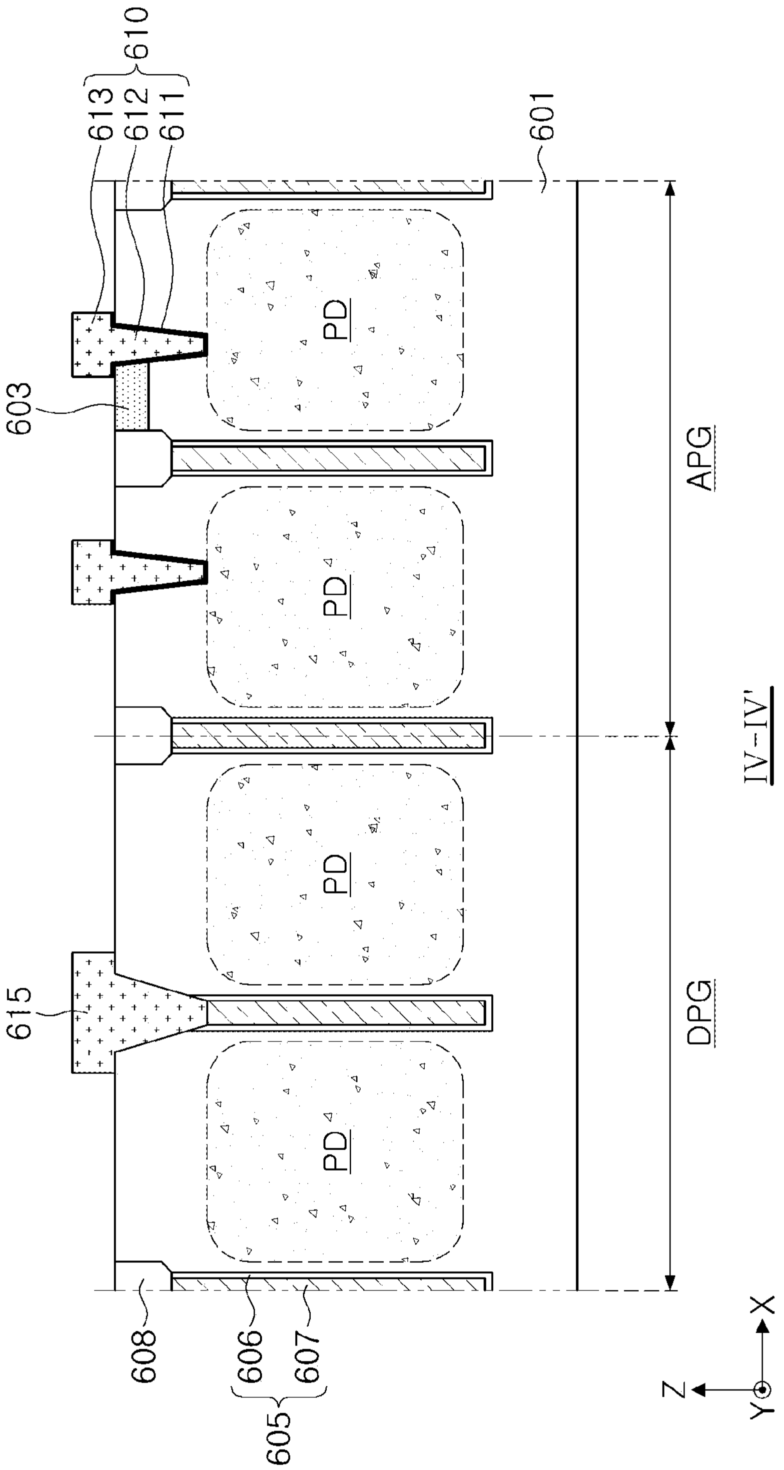
Figure 24:
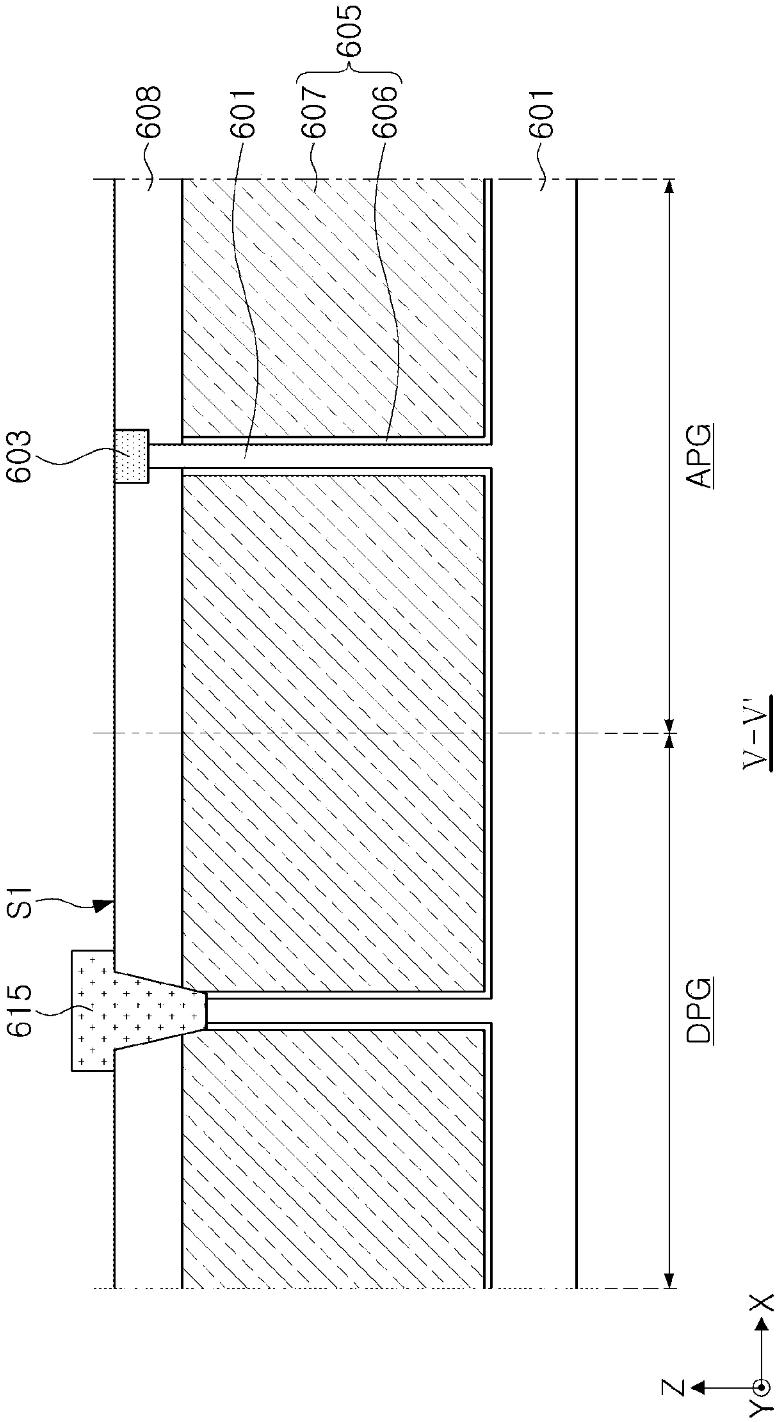

Referring to FIGS. 22 to 24, a vertical structure 615 may be formed in the first trench T1, and a transfer gate 610 may be formed in the second trench T2. The transfer gate 610 may include a gate insulating layer 611 and a gate electrode layer (612 and 613). The vertical structure 615 may have a structure similar to that of the transfer gate 610.

For example, before forming the vertical structure 615, the gate insulating layer 611 may be formed first while covering the first trench T1 and exposing only the second trench T2. Afterwards, while both the first trench T1 and the second trench T2 may be exposed, the vertical structure 615 and the gate electrode layer (612 and 613) may be formed together using a material such as polysilicon or the like.

The first trench T1 for forming the vertical structure 615 and the second trench T2 for forming the transfer gate 610 may be formed simultaneously in one etching process as described above with reference to FIGS. 19 to 21. In addition, the vertical structure 615 may be formed in the same process as the gate electrode layer (612 and 613). Therefore, the vertical structure 615 may be formed without increasing the number of process operations. Referring to FIG. 24, the vertical structure 615 may be in direct contact with the second isolation film 607 exposed at a portion of the sidewall of the first trench T1.

Figure 25:
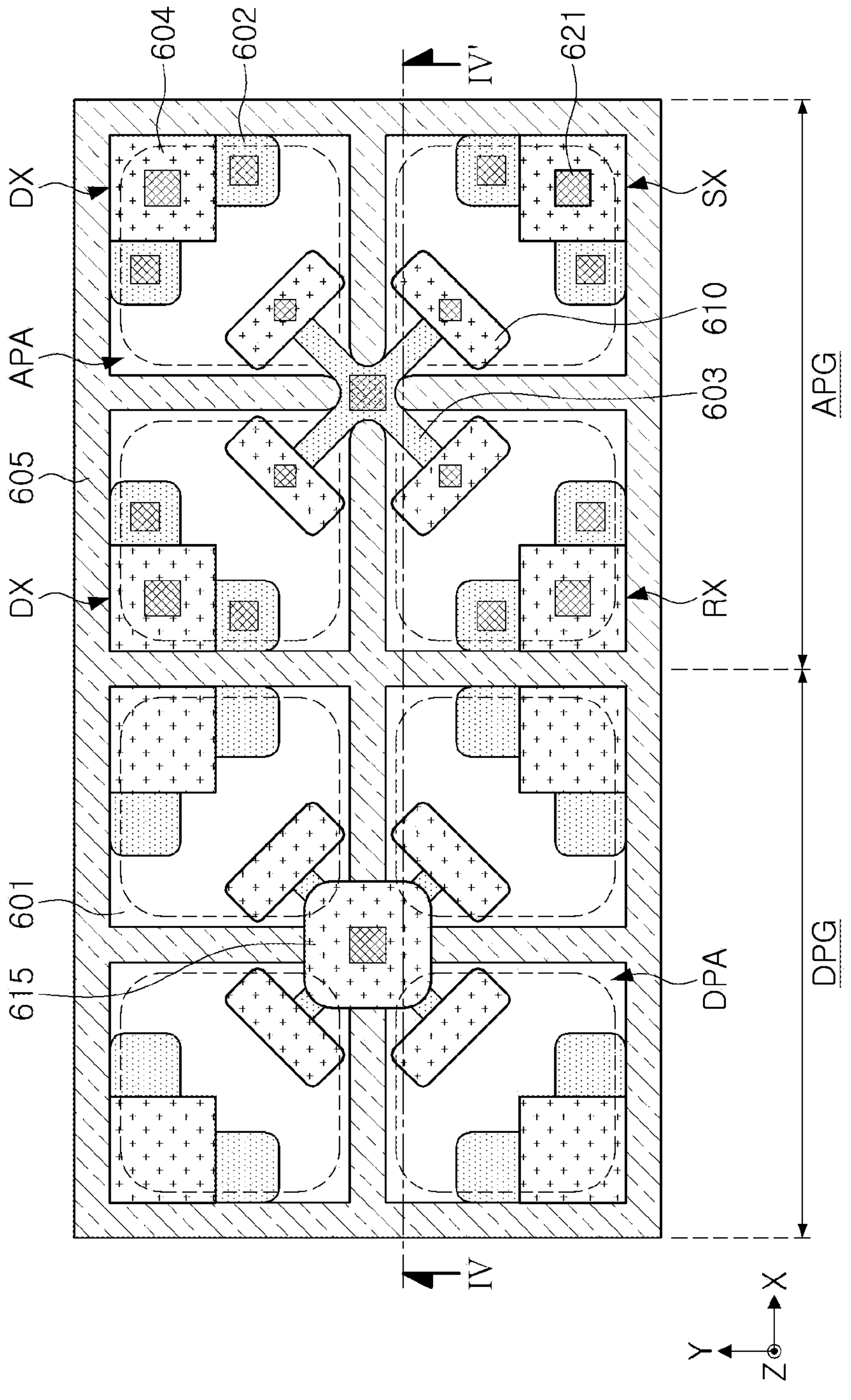
Figure 26:
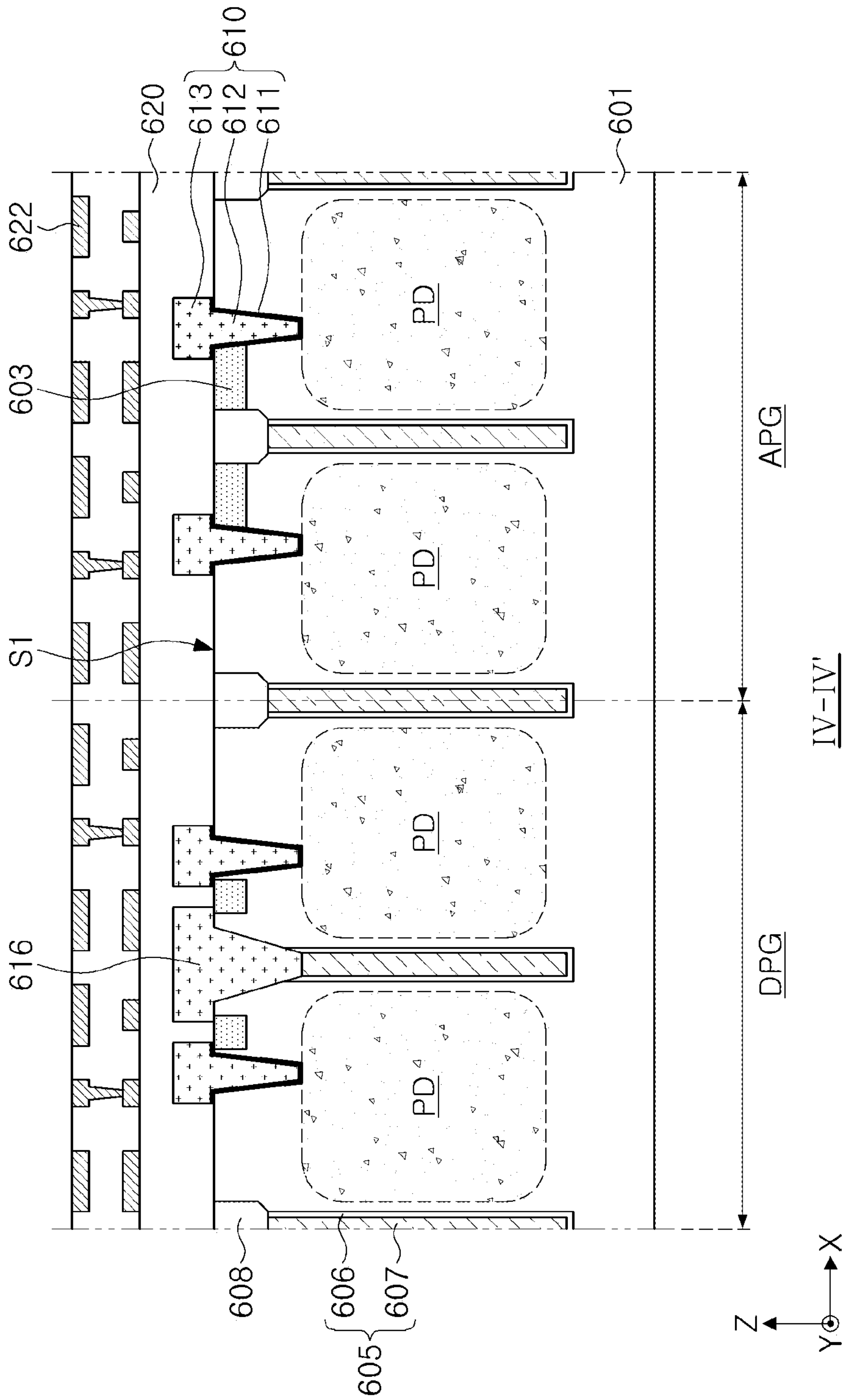

Referring to FIGS. 25 and 26, a plurality of contacts 621, interconnection patterns 622, and an interlayer insulating layer 620 may be formed on the first surface S1 of the substrate 601. The plurality of contacts 621 may be connected to the vertical structure 615 without being connected to the active regions 602 and the gate structures 604 formed in the dummy pixel regions DPA.

Figure 27:
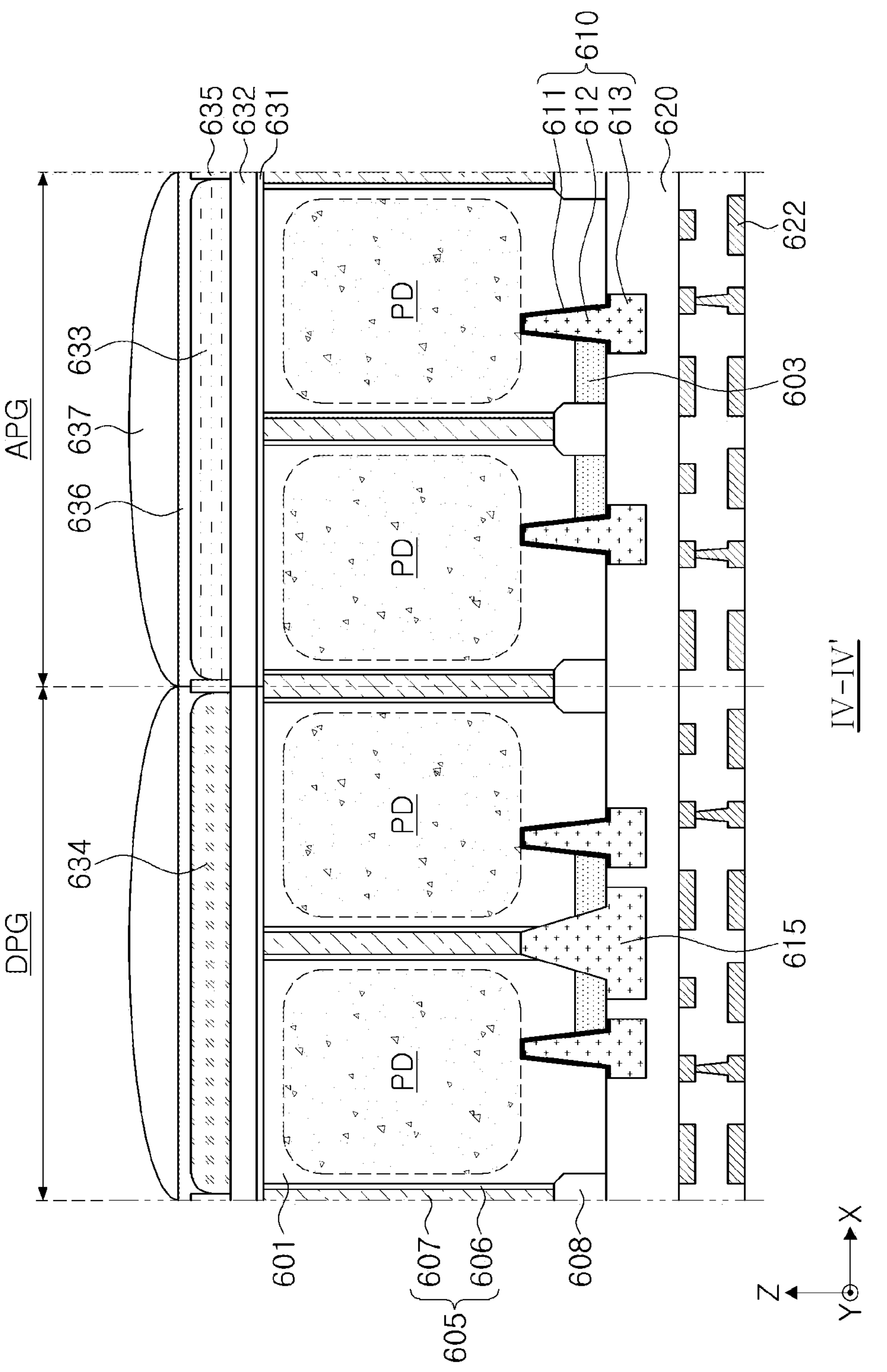

Next, referring to FIG. 27, a horizontal insulating layer (631 and 632), color filters 633 and 634, a grid pattern 635, a planarization layer 636, a micro lens 637, and the like may be formed on a second surface S2 of the substrate 601. Before forming the horizontal insulating layer 631, a chemical mechanical polishing (CMP) process or the like may first be performed to remove a portion of the substrate 601 from a side, opposite to the first surface S1. As a thickness of the substrate 601 is reduced by the CMP process, one end of the pixel isolation film 605 may be extended to the second surface S2.

The vertical structure 615 may be connected to the contact 621 to provide a transmission path for a bias voltage applied to the pixel isolation film 605. In some implementations, because the vertical structure 615 is formed on the first side S1 of the substrate 601, it is possible to perform characteristic verification of the pixel isolation film 605 before the manufacturing process of the image sensor is completed. Hereinafter, this will be described in more detail with reference to FIG. 28.

Figure 28:
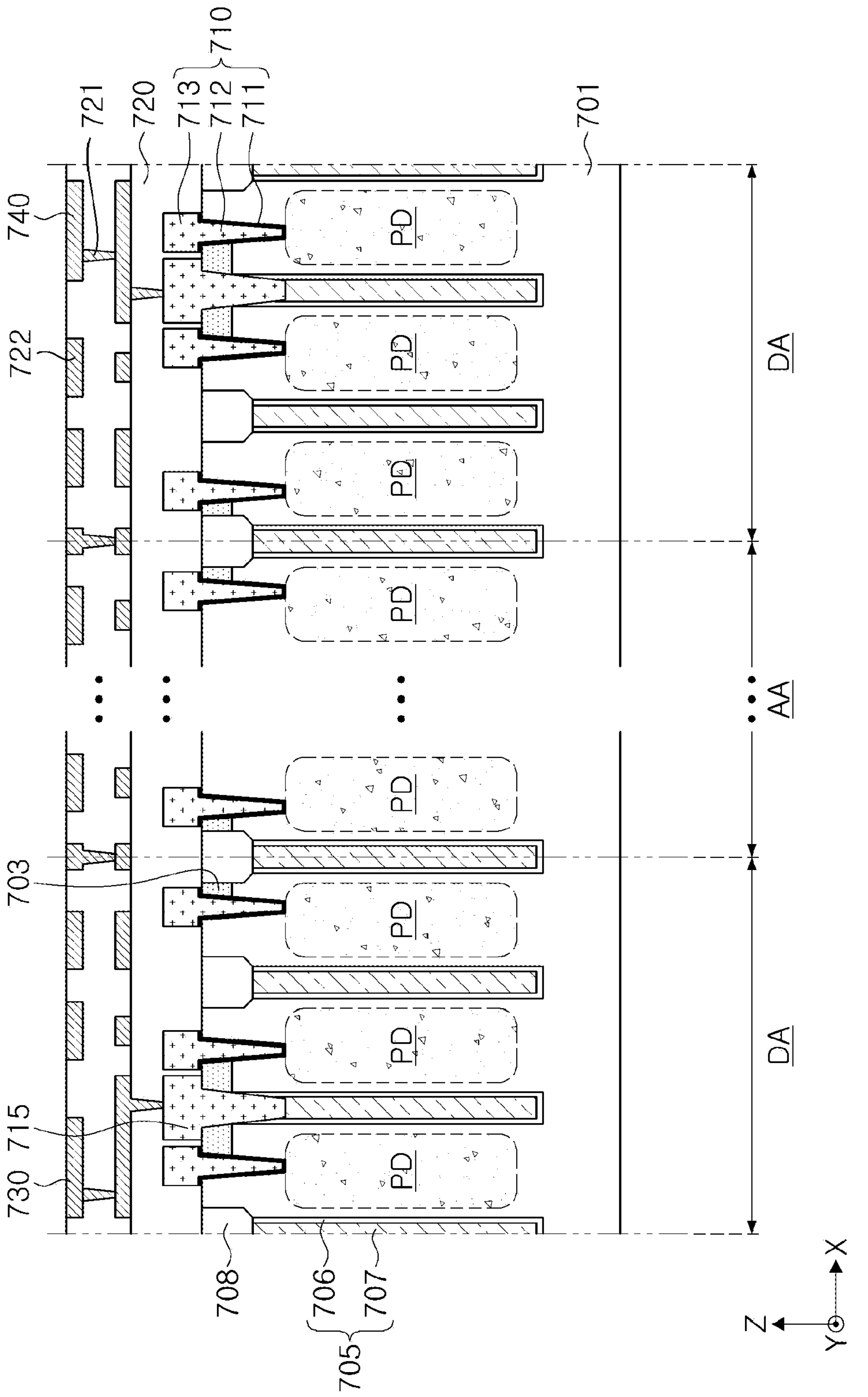
FIG. 28 is a cross-sectional view schematically illustrating a portion of an example of a pixel array included in an image sensor.

FIG. 28 is a view schematically illustrating an example of a portion of a pixel array included in an image sensor. Referring to FIG. 28, a pixel array 600 may include an effective region AA and a dummy region DA, and the dummy region DA may be disposed around the effective region AA. Photodiodes PD along pixel regions defined by a pixel isolation film 705 may be disposed in a substrate 701, and a device isolation film 708 may be disposed on one end of the pixel isolation film 705 close to a first surface S1 of the substrate 701. The pixel isolation film 705 may extend in the first direction (X-axis direction) and the second direction (Y-axis direction) in the substrate 701.

An interlayer insulating layer 720, a plurality of contacts 721, and a plurality of interconnection patterns 722 may be disposed on the first surface S1 of the substrate 701. Referring to FIG. 28, vertical structures 715 disposed in the dummy region DA and in direct contact with the pixel isolation film 705 may be connected to a first pad 730 and a second pad 740 through some of the contacts 721 and the interconnection patterns 722.

In some implementations, as illustrated in FIG. 28, the electrical characteristics of the pixel isolation film 705 may be verified in a process operation before a color filter, a micro lens, or the like is formed. For example, a predetermined voltage may be applied to the first pad 730 and voltage may be detected at the second pad 740, to test defects and electrical characteristics of the pixel isolation film 705.

The vertical structures 715 may provide an application path of a bias voltage to remove charges generated in the substrate 701 due to other causes besides externally introduced light. For example, a negative bias voltage less than 0 V may be applied to the pixel isolation film 705 through the vertical structures 715. Charges such as holes or the like generated in the substrate 701 due to a change in temperature or the like may be effectively removed by the negative bias voltage, and a dark current, dark level characteristics, or the like of the image sensor may be improved.

Accordingly, a dummy region in which dummy pixel regions are disposed may be defined around an effective region in which effective pixel regions are disposed, and a vertical structure connected to a pixel isolation film may be formed in the dummy region. A bias voltage may be applied to remove charges of a substrate through the vertical structure, and the vertical structure may be formed together with a transfer gate of each of the effective pixel regions. Therefore, a process for forming the vertical structure may be simplified, and voltage may be applied to the vertical structure formed in the dummy region to effectively verify characteristics of the pixel isolation film. Various advantages and effects provided by the present disclosure are not limited to these, and will be understood by those skilled in the art based on the entirety of the foregoing disclosure.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While various examples have been illustrated and described above, it will be apparent to those skilled in the art that modifications and variations could be made without departing from the scope of the present disclosure.

What is claimed is:

1. An image sensor comprising:

a pixel array comprising a plurality of pixel regions arranged along a first direction and a second direction, wherein the first direction and the second direction intersect each other and are parallel to a first surface of a substrate, wherein the plurality of pixel regions each comprise least one photodiode, and a pixel isolation film disposed between the plurality of pixel regions, wherein the pixel array includes an effective region in which functional pixel regions among the plurality of pixel regions are disposed, and a dummy region in which dummy pixel regions among the plurality of pixel regions are disposed, wherein two or more functional pixel regions adjacent in at least one of the first direction or the second direction form an effective pixel group, and wherein the effective pixel group includes a floating diffusion region shared by two or more photodiodes of the two or more functional pixel regions of the effective pixel group, wherein two or more dummy pixel regions adjacent in at least one of the first direction or the second direction form a dummy pixel group, and wherein the dummy pixel group includes a vertical structure contacting the pixel isolation film in the substrate, and wherein the floating diffusion region is disposed in a central portion of the effective pixel group, and the vertical structure is disposed in a central portion of the dummy pixel group.

2. The image sensor of claim 1, wherein the pixel isolation film comprises a first isolation film and a second isolation film disposed adjacent to the first isolation film in the first and second directions, and wherein the vertical structure is in contact with the second isolation film.

3. The image sensor of claim 2, wherein the first isolation film comprises silicon oxide, and the second isolation film comprises polysilicon.

4. The image sensor of claim 1, wherein each of the plurality of pixel regions comprises a device isolation film formed of an insulating material, wherein the device isolation film extends to a predetermined depth from the first surface of the substrate, wherein the first surface is an upper surface of the substrate, and wherein in a third direction, perpendicular to the first surface, a lowermost end of the vertical structure is lower than a lowermost end of the device isolation film.

5. The image sensor of claim 4, wherein a transfer gate including a gate insulating layer and a gate electrode layer disposed on the gate insulating layer is disposed in each of the functional pixel regions, wherein the gate electrode layer includes a first electrode region disposed below the first surface and a second electrode region disposed on the first surface, and wherein, in the third direction, a lowermost end of the first electrode region is lower than the lowermost end of the device isolation film.

6. The image sensor of claim 5, wherein, in the third direction, at least one of the lowermost end of the first electrode region or a lowermost end of the gate insulating layer is disposed at a height substantially equal to a height of the lowermost end of the vertical structure.

7. The image sensor of claim 5, wherein, in the third direction, an uppermost end of the first electrode region is disposed at a height substantially equal to a height of an uppermost end of the vertical structure.

8. The image sensor of claim 4, wherein the vertical structure is in contact with the device isolation film in the first direction and the second direction.

9. The image sensor of claim 4, wherein, in the third direction, one surface of the pixel isolation film is in contact with the device isolation film, and another surface of the pixel isolation film extends to a second surface of the substrate, parallel to the first surface.

10. The image sensor of claim 1, wherein a position at which the floating diffusion region is disposed in the effective pixel group is the same as a position at which the vertical structure is disposed in the dummy pixel group.

11. The image sensor of claim 1, wherein the floating diffusion region is connected to an active region of each of the two or more functional pixel regions in a diagonal direction, intersecting the first direction and the second direction and parallel to the first surface.

12. The image sensor of claim 1, wherein the effective pixel group comprises four functional pixel regions disposed in a 2×2 configuration in the first direction and the second direction, and wherein the dummy pixel group comprises four dummy pixel regions disposed in a 2×2 configuration in the first direction and the second direction.

13. The image sensor of claim 1, wherein the dummy region comprises a first dummy region disposed around the effective region in the first direction and the second direction, and a second dummy region extending in at least one of the first direction or the second direction and dividing the effective region into a plurality of effective regions.

14. An image sensor comprising:

a pixel array including a pixel isolation film extending in a first direction and a second direction, wherein the first direction and the second direction intersect each other and are parallel to a first surface of a substrate, and a plurality of pixel regions separated by the pixel isolation film, each of the plurality of pixel regions including a photodiode; and a logic circuit configured to acquire a pixel signal from the pixel array, wherein the pixel isolation film includes a first isolation film and a second isolation film, wherein the second isolation film is disposed inside the first isolation film in the first direction and the second direction, wherein the pixel array includes an effective region in which functional pixel regions are disposed, and a dummy region in which dummy pixel regions are disposed around the effective region, and wherein the dummy region includes at least one vertical structure extending from the first surface to a predetermined depth in a third direction and contacting the second isolation film within the substrate, wherein the third direction is perpendicular to the first surface.

15. The image sensor of claim 14, wherein each of the functional pixel regions comprises a respective transfer gate, wherein each transfer gate includes a gate insulating layer and a gate electrode layer disposed on the gate insulating layer, and wherein the gate electrode layer and the vertical structure include a same material.

16. The image sensor of claim 14, wherein the vertical structure and the second isolation film comprise polysilicon.

17. The image sensor of claim 14, wherein the vertical structure is in direct contact with the second isolation film in at least one of the first direction or the second direction.

18. An image sensor comprising:

a pixel array including a pixel isolation film extending in a first direction and a second direction, wherein the first direction and the second direction intersect each other and are parallel to a first surface of a substrate, a device isolation film disposed between the first surface and the pixel isolation film, a plurality of photodiodes disposed between portions of the pixel isolation film, and a vertical structure extending into the substrate, from the first surface of the substrate, to a depth that is further than a depth of the device isolation film; and a logic circuit configured to acquire a pixel signal from the pixel array, wherein the pixel isolation film includes a first isolation film in direct contact with the substrate and arranged in the substrate, and a second isolation film disposed inside the first isolation film and in direct contact with the vertical structure in at least one of the first direction or the second direction, and wherein the logic circuit is configured to apply a negative bias voltage to the second isolation film through the vertical structure.

19. The image sensor of claim 18, wherein the pixel array further comprises a plurality of transfer gates extending from the first surface to a predetermined depth in the substrate, wherein the plurality of transfer gates are disposed on the plurality of photodiodes in a third direction, perpendicular to the first surface, and wherein the predetermined depth to which the plurality of transfer gates extend is greater than a depth of the device isolation film in the substrate.

20. The image sensor of claim 19, wherein each of the plurality of transfer gates comprises a gate insulating layer and a gate electrode layer, and wherein the gate electrode layer includes a same material as the vertical structure.

* * * * *